United States Patent [19]

Yamanaka et al.

[11] Patent Number: 5,132,771
[45] Date of Patent: Jul. 21, 1992

[54] SEMICONDUCTOR MEMORY DEVICE HAVING FLIP-FLOP CIRCUITS

[75] Inventors: Toshiaki Yamanaka, Hoya; Naotaka Hashimoto; Takashi Hashimoto, both of Hachioji; Akihiro Shimizu, Akishima; Koichiro Ishibashi, Tokyo; Katsuro Sasaki, Fuchu; Katsuhiro Shimohigashi, Musashimurayama; Eiji Takeda, Koganei; Yoshio Sakai, Kanagawa; Takashi Nishida, Tokyo; Osamu Minato, Tokyo; Toshiaki Masuhara, Tokyo; Shoji Hanamura, Kokubunji; Shigeru Honjo, Otsuki; Nobuyuki Moriwaki, Kodaira, all of Japan

[73] Assignees: Hitachi, Ltd; Hitachi VLSI Engineering Corporation, Tokyo, Japan

[21] Appl. No.: 503,928

[22] Filed: Apr. 4, 1990

Related U.S. Application Data

[60] Continuation-in-part of Ser. No. 344,601, Apr. 28, 1989, abandoned, which is a division of Ser. No. 946,776, Dec. 29, 1986, Pat. No. 4,841,486.

[30] Foreign Application Priority Data

Dec. 27, 1985 [JP] Japan .................. 60-292899
Apr. 14, 1989 [JP] Japan .................. 1-93024
May 29, 1989 [JP] Japan .................. 1-132642

[51] Int. Cl.$^5$ .............. H01L 29/04; H01L 27/02; H01L 29/10; H01L 29/06
[52] U.S. Cl. ...................... 357/59; 357/51; 357/23.3; 357/20
[58] Field of Search ............. 357/59 F, 59 E, 51, 357/23.3, 20

[56] References Cited

U.S. PATENT DOCUMENTS

| | | | |
|---|---|---|---|
| 4,481,524 | 11/1984 | Tsujide | 357/51 |
| 4,535,426 | 8/1985 | Ariizumi et al. | 357/51 |
| 4,609,835 | 9/1986 | Sakai et al. | 357/59 F |
| 4,797,725 | 1/1989 | Hashimoto | 357/51 |

FOREIGN PATENT DOCUMENTS 62-154287 7/1987 Japan .

Primary Examiner—Rolf Hille
Assistant Examiner—Robert P. Limanek
Attorney, Agent, or Firm—Antonelli, Terry, Stout & Kraus

[57] ABSTRACT

A semiconductor static random access memory having a high α-ray immunity and a high packing density is provided which is also capable of high-speed operation. A semiconductor memory device comprises static random access memory cells each including a flip-flop circuit. Storage nodes of each flip-flop circuit have respective pn-junctions formed at regions sandwiched between gate electrodes of first insulated gate field effect transistors and gate electrodes of second insulated gate field effect transistors, respectively. The pn-junction has an area smaller than that of a channel portion of the first or second insulated gate field effect transistor. The gate electrode of one of the two first insulated gate field effect transistors and the drain region of the other insulated gate field effect transistor, on one hand, and the drain region of the one insulated gate field effect transistor and the gate electrode of the other insulated gate field effect transistor, on the other hand, are electrically cross-coupled mutually through first and second electrically conductive films, respectively. Also, to increase packing density and enhance immunity to soft error, the gate electrodes of the first and second insulated gate field effect transistors extend substantially in parallel with one another and the channel regions of the first and second insulated gate field effect transistors extend substantially in parallel with one another.

23 Claims, 39 Drawing Sheets

FIG. IA
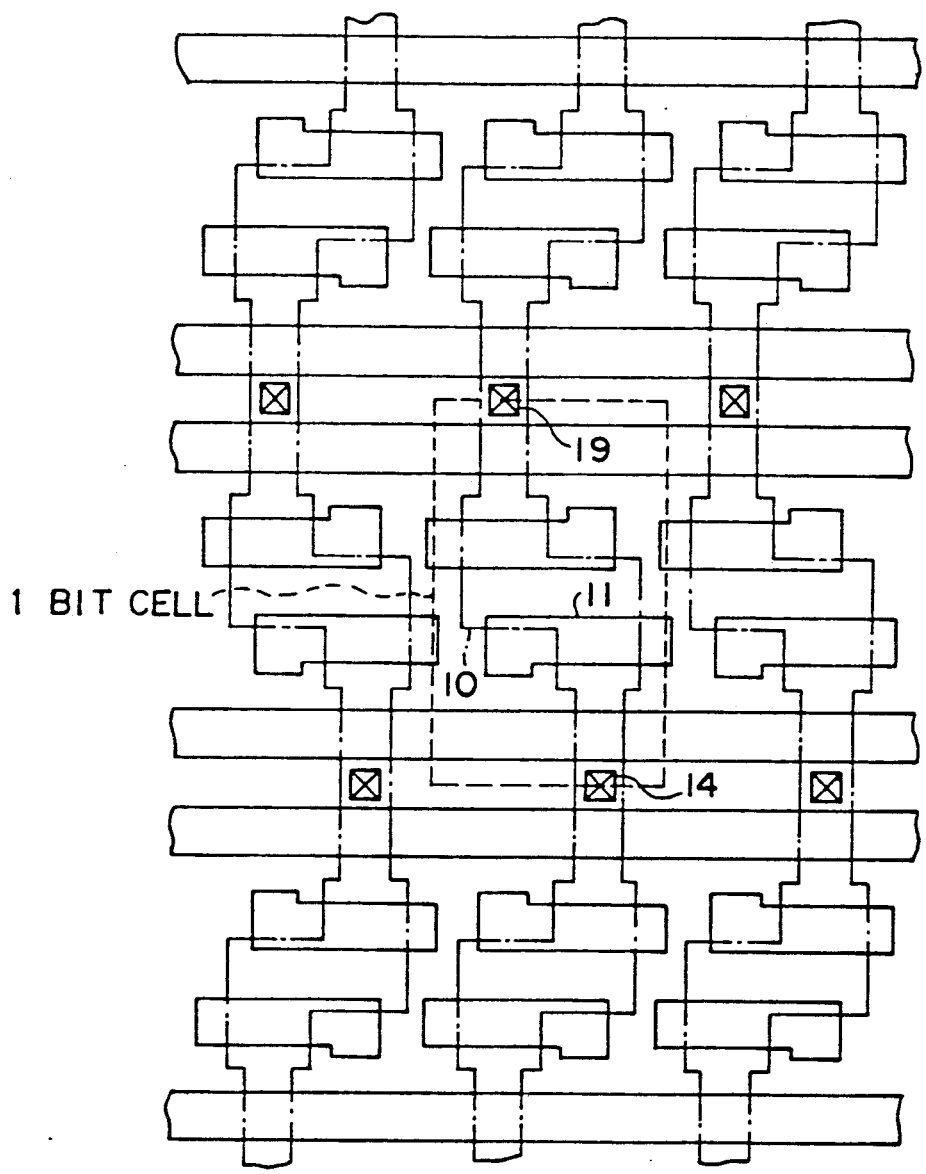

1 CELL

1 CELL

F I G. 7
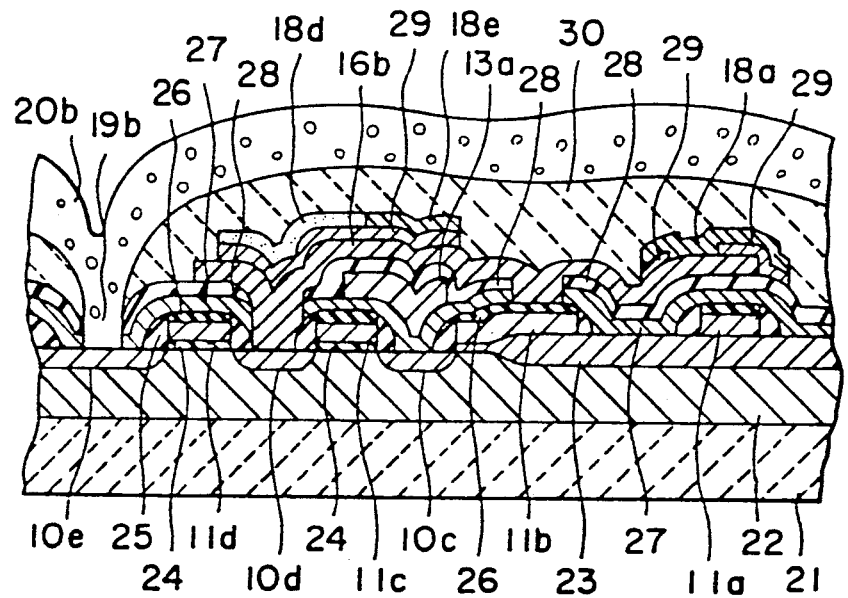

F I G. 13
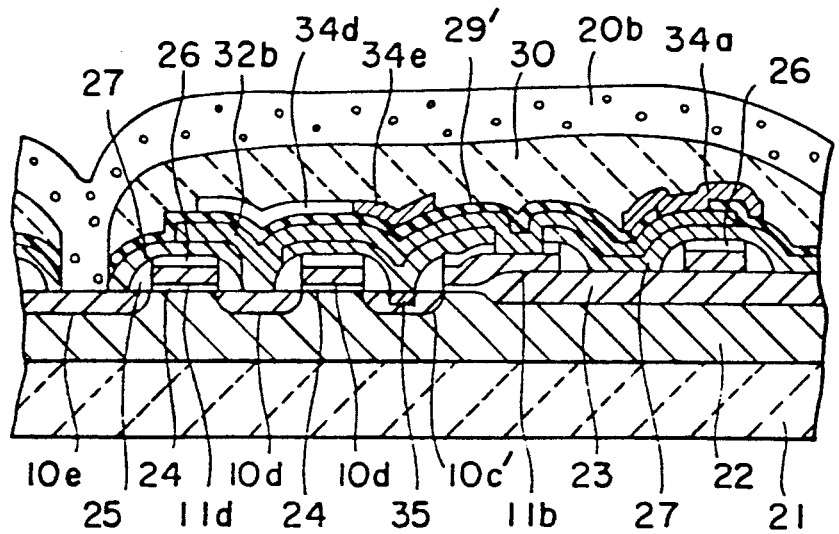
F I G. 14
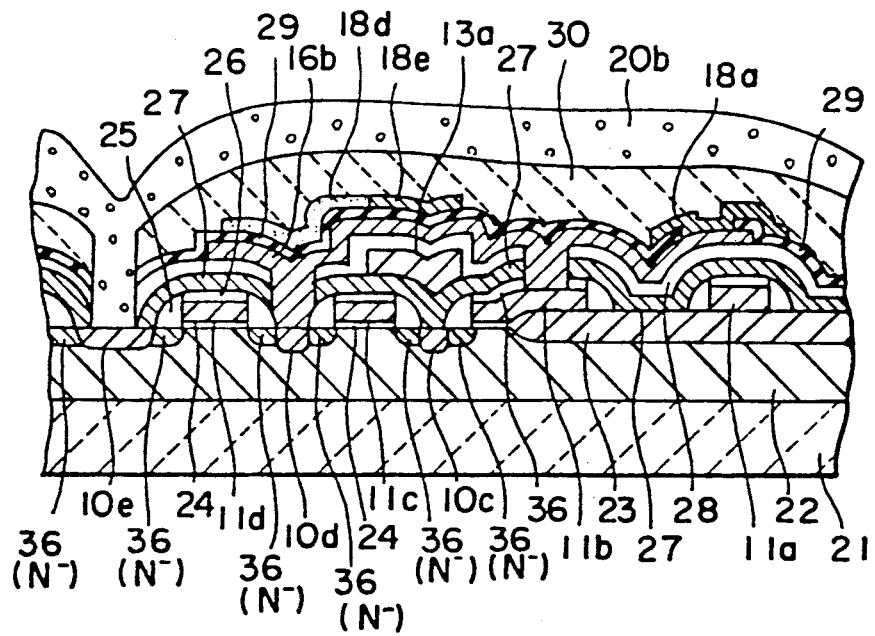

F I G. 16
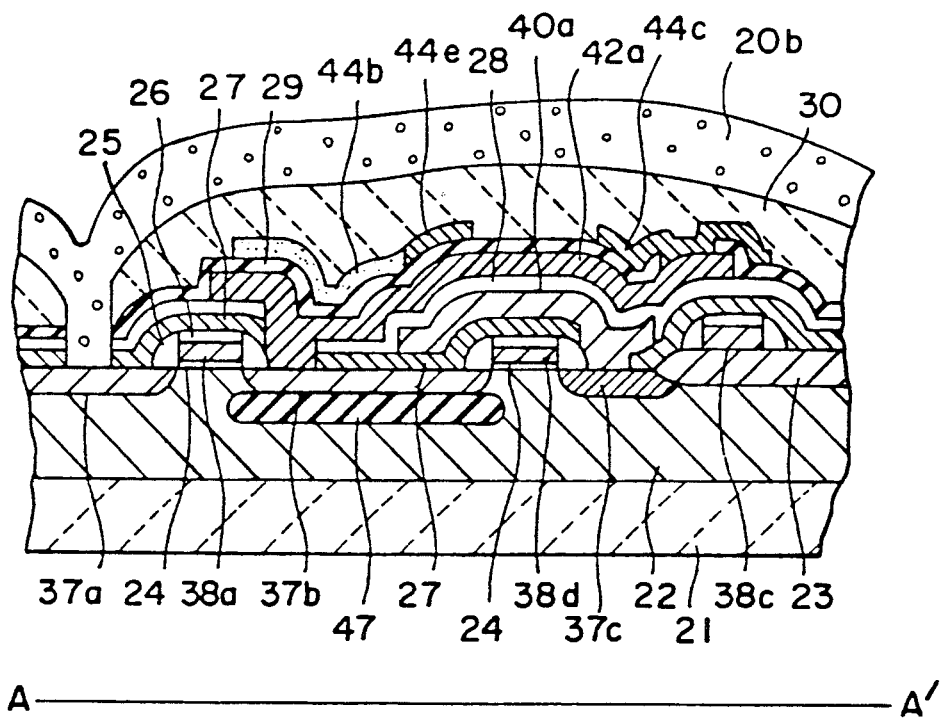

F I G. 17A
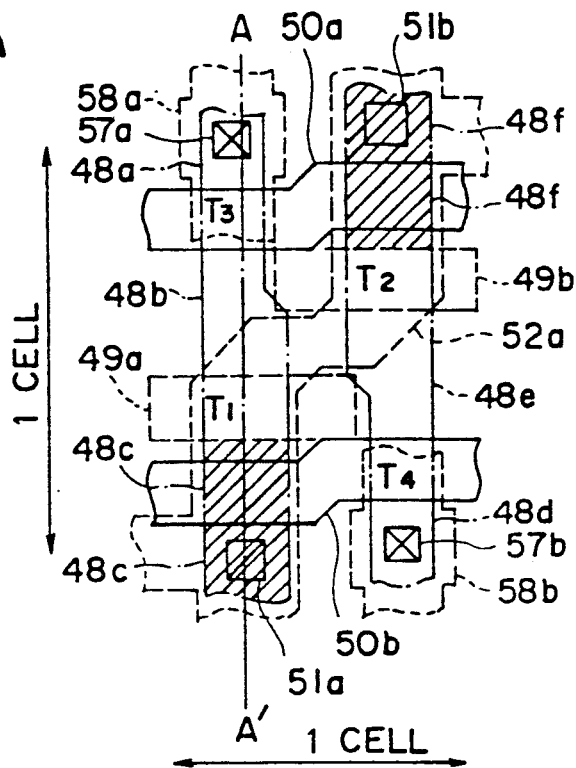
F I G. 17B
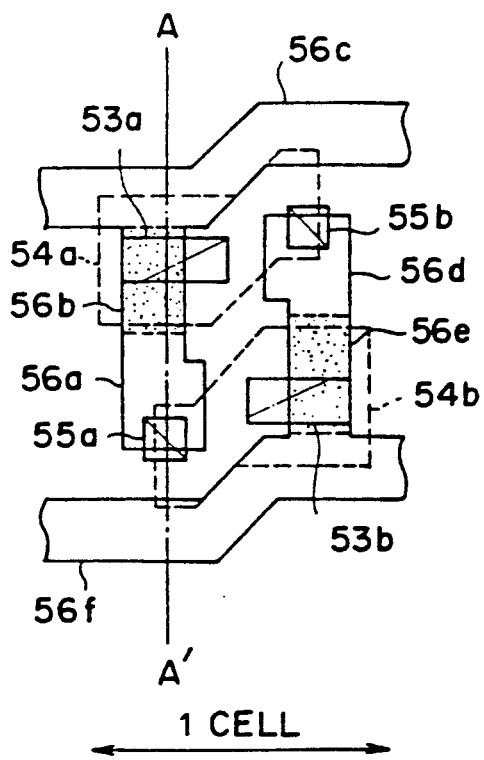

MEMORY CELL

F I G. 32C
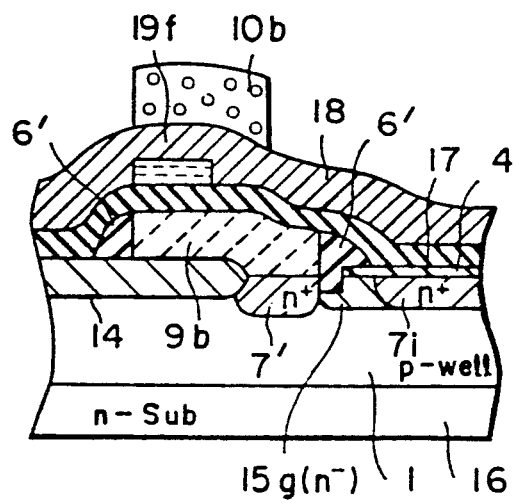
F I G. 32D
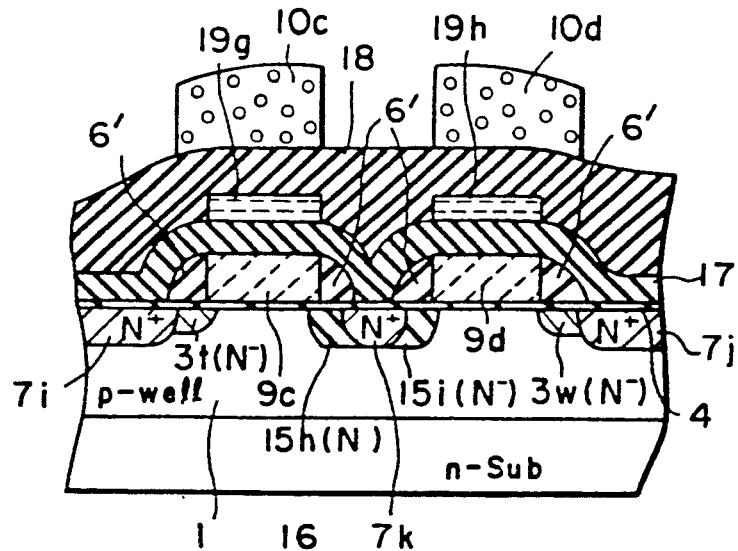

F I G. 34A
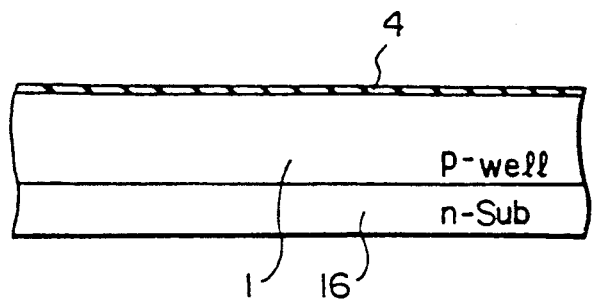
F I G. 34B
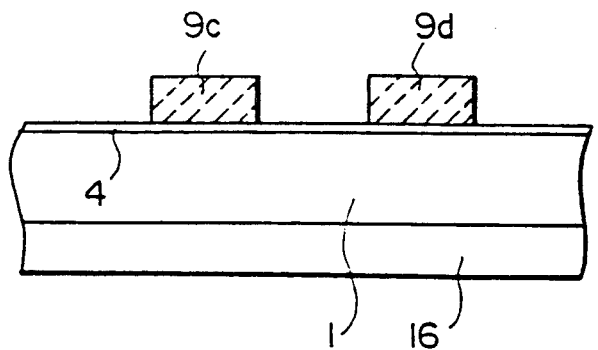
F I G. 34C
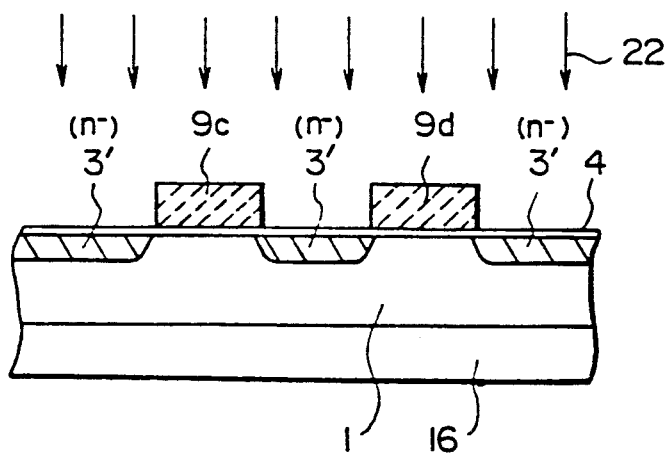

F I G. 37
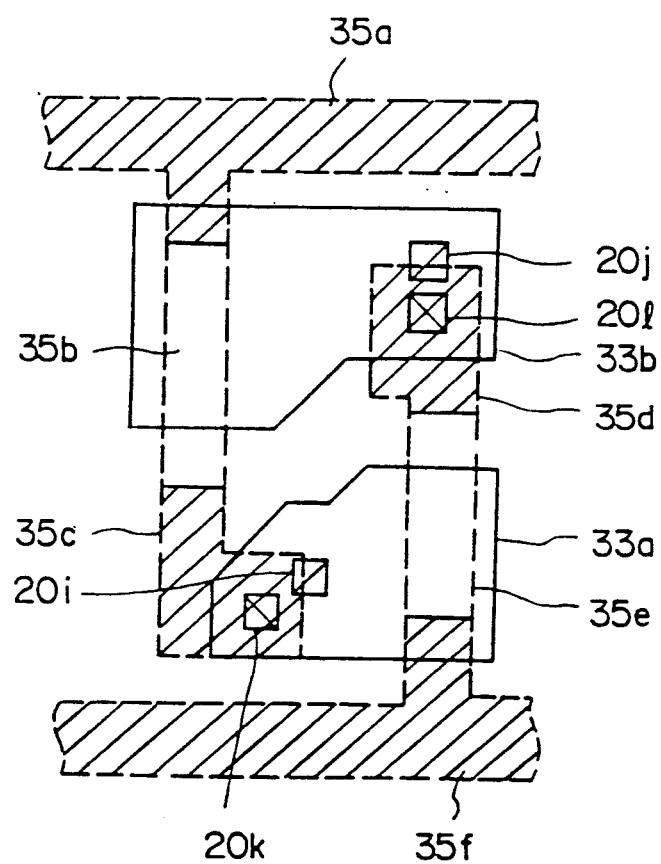

SEMICONDUCTOR MEMORY DEVICE HAVING FLIP-FLOP CIRCUITS

This application is a continuation-in-part application of U.S. patent application Ser. No. 344,601 filed Apr. 28, 1989, now abandoned, which is a divisional application of U.S. patent application Ser. No. 946,776 filed Dec. 29, 1986, now U.S. Pat. No. 4,841,486 issued Jun. 20, 1989.

BACKGROUND OF THE INVENTION

The present invention relates generally to a semiconductor memory device, and more particularly to a static random access memory device having a high packing density, a super-low power dissipation and a high soft-error immunity, as well as a method of manufacturing the same.

As can be seen in an equivalent circuit diagram shown in FIG. 3, the static random access memory cell of a high packing density known heretofore in which there are employed insulated gate field-effect transistors (IGFET in abbreviation and also referred to as the MOS transistor in the most general term) is composed of a flip-flop circuit constituted by a pair of driver MOS transistors $T_1$ and $T_2$ cross-coupled to each other, highly resistive loads $R_1$ and $R_2$ connected to a pair of storage nodes $N_1$ and $N_2$ of the flip-flop circuits for supplying extremely small currents to the storage nodes $N_1$ and $N_2$ for retaining data thereat, respectively, and transfer MOS transistors $T_3$ and $T_4$ connected to the storage nodes $N_1$ and $N_2$ for performing "write" and "read" of the data retained thereat, wherein the flip-flop circuit is supplied with a power supply voltage $V_{cc}$ and the ground potential with data lines 1 and 1' being connected to the transfer MOS transistors and with a common gate constituting a word line. For operation of such static random access memory cell, the word line is activated for allowing the data of "High" or "Low" to be stored at the storage nodes $N_1$ and $N_2$, or, alternatively, to allow the states of the storage nodes to be read out through the data line and the transfer MOS transistors, as is well known in the art.

FIG. 4 shows in a plan view a typical one of the static random access memory cells of the prior art described above, which is disclosed in, for example, "NIKKEI ELECTRONICS", May 21, 1984, pp. 181-199 and Dec. 30, 1985, pp. 117-145. The prior art static random access memory cell will be described below in more detail by reference to FIG. 4.

In FIG. 4, reference symbols 57c and 57d denote gate electrodes of the driver MOS transistors $T_1$ and $T_2$, respectively, and 5a denotes a common gate electrode of transfer MOS transistors $T_3$ and $T_4$. A highly concentrated n-type impurity region 3d which is to constitute a drain of the driver MOS transistor $T_1$ is provided in common to an n-type impurity region of the transfer MOS transistor 3d. Further, a highly concentrated n-type impurity region 3e which is to serve as a drain of the driver MOS transistor $T_2$ is electrically connected to an n-type impurity region 3c of the transfer MOS transistor $T_4$ by way of the gate electrode 5b while the gate electrode 5c of the driver MOS transistor $T_2$ is electrically connected to the n-type impurity region 3d which is common to both the transfer MOS transistor $T_3$ and the driver MOS transistor $T_1$ to thereby realize the cross-coupling of the flip-flop circuit of the static random access memory cell.

Holes 6a and 6b for interconnection are formed in the gate electrodes 5b and 5c, wherein highly resistive polysilicon films 7c and 7d are connected to the gate electrodes 5b and 5c through low resistive polysilicon films 7a and 7b, respectively. Further, a low resistive polysilicon film 7e constitutes a common power supply voltage line connected to the highly resistive polysilicon film 7e.

Aluminum (Al) electrodes 9a and 9b which are to serve as two data lines in the memory cell are electrically connected to highly concentrated impurity regions 3a and 3b of the transfer MOS transistors $T_4$ and $T_3$ through holes 8a and 8b for interconnection, respectively.

SUMMARY OF THE INVENTION

After having examined the prior art static random access memory cells described above, the present inventors have found problems which will be mentioned below.

When α-rays produced upon decay of uranium (U) and/or thorium (Th) contained in trace amounts in a material such as resin used for mounting of a memory chip and/or a wiring material such as aluminum are incident on the storage node of the "High" state in the memory cell, electron-hole pairs appear in the projected range of the α-rays to be attracted to the storage node under the electric field in a depletion region to thereby vary the potential of the storage node, which may result in that the stored charge in the memory vanishes when the change in the potential at the storage node is sufficiently large for inversion of the flip-flop. This is a phenomenon referred to as the soft error. Such soft error can be reduced by increasing the amount of charge stored at the storage node or by decreasing the amount of charge as collected by diminishing the area of the pn-junction formed at the storage node. However, in the case of the memory cell structures known heretofore, there exist the problems mentioned below.

(1) Taking as an example the storage node constituted by the drain region of the driver MOS transistor $T_1$ shown in FIG. 4, it has previously been necessary to provide a tolerance or margin between the hole 4b and the gate electrodes 5a, 5b in order to prevent them from overlapping each other due to mask misalignment or for other reasons. Besides, the distance between the gate electrodes 5a and 5b can not be reduced down to a minimum size at which the distance between the gate electrode 5a of the transfer MOS transistor $T_3$ and the gate electrode 5b of the driver MOS transistor $T_1$ can be realized, because the gate electrode 5c must be connected to the highly concentrated n-type impurity region 3a, presenting an obstacle in reducing the area of the pn-junction of the storage node in the memory cell.

(2) It is known that the drivability ratio of more than three between the driver MOS transistor and the transfer MOS transistor is effective for assuring stable operation of the memory cell even in the case of lowering of the power supply voltage. For this reason, the driver MOS transistor has heretofore been implemented with a channel width at least three times as large as that of the transfer MOS transistor. However, when the transfer MOS transistor and the driver MOS transistor are disposed closely to each other, as illustrated in FIG. 5A, the distances a and b from the locations where the channel width changes to the gate electrode 5d and 5e, respectively, are shortened to cause the channel widths $w_1$ and $w_2$ of the transfer MOS transistor and the driver MOS transistor to change due to mask misalignment, which in turn degrades the stability of operation of the memory cell. In particular, when the channel width ratio mentioned above is large or when photolithography technique using a light beam is employed, actual pattern becomes uncertain or indefinite (being rounded at corners), as is illustrated in FIG. 5B, making more serious the problem of degradation in the stability.

According to the present invention, there is realized a semiconductor memory device comprising static random access memory cells each including a flip-flop circuit constituted by insulated gate field effect transistors, wherein complementary flip-flop circuits each including two transfer insulated gate field effect transistors of a first conductivity type, two driver insulated gate field effect transistors and third insulated gate field effect transistors disposed on at least given ones of the abovementioned insulated gate field effect transistors and having channel regions formed of a polycrystal silicon film and disposed above the gate electrodes are formed on a substrate, wherein the ratio of drivability between the driver insulated gate field effect transistor and the transfer insulated gate field effect transistor is reduced, wherein the gate electrode of the driver insulated gate field effect transistor and the gate electrode of the transfer insulated gate field effect transistor are disposed closely and in parallel to each other, wherein the gate electrode of the third insulated gate field effect transistor is insulated automatically in a self-aligning manner from the gate electrodes of said driver and transfer insulated gate field effect transistors, plate electrodes of capacitor elements and grounded wiring such that no short-circuit is formed even when mask misalignment for interconnecting holes takes place and is connected to the storage node of the aforementioned flip-flop circuit, and wherein the wiring for the cross-coupling in the flip-flop circuit is realized by the gate electrode of the abovementioned third insulated gate field effect transistor.

Due to reduction in the area of the pn-junction forming the storage node of the static random access memory cell, the area of the memory cell can effectively be diminished, while soft error can effectively be prevented because the absolute amount of electron-hole pairs produced upon irradiation with α-rays and collected at the storage node can be decreased.

Further, the capacitor elements of stacked structure connected to the storage nodes can effectively increase the amount of charge stored at the storage nodes, which contributes to reduction of the soft error as well.

Besides, by realizing a complementary inverter by using stacked PMOS transistors in the flip-flop circuit of the memory cell, the potential of the storage node assuming "High" level in the flip-flop circuit of the memory cell is fixed by on-operation of the PMOS transistor, which not only allows operation of the memory cell to be stabilized without need for increasing the area of the memory cell but also makes it possible to diminish the ratio in the channel width between the transfer MOS transistor and the driver MOS transistor. Thus, the area of the memory cell can be reduced and at the same time the gate electrodes of the transfer MOS transistor and the driver MOS transistor can be disposed closely to each other without degrading the stability of operation of the memory cell, whereby an extremely small active region for the storage node can be realized with the soft error being effectively reduced.

Additionally, since the gate electrode of the stacked PMOS transistor can be automatically insulated in a self-aligning manner from the gate electrodes of the driver MOS transistor and the transfer MOS transistor, plate electrodes of the capacitor element and the grounded wiring, and, at the same time, can be used as the wiring for the cross-coupling interconnections in the flip-flop circuit, the capacity of the capacitor element can effectively be increased with the soft error being correspondingly reduced while diminishing the area of the memory cell.

An object of the present invention is to solve the problems of the prior art techniques and to provide a semiconductor memory device including static random access memory cells capable of performing stably the memory operation with an enhanced soft-error immunity.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIGS. 1A, 1B and 1C, FIG. 8A-B, FIG. 12A-B, FIG. 15A-B, FIG. 17A-B, FIG. 19A-B and FIG. A-B are plan views showing exemplary embodiments of the invention.

FIG. 2, FIG. 6A-G, FIG. 7, FIG. 9, FIG. 10A-E, FIG. 13, FIG. 14, FIG. 16, FIG. 18, FIG. 20, FIG. 21, FIG. 22, FIG. 23, FIG. 24, FIG. 25, FIG. 26, FIG. 28A-C and FIG. 30 are sectional views of other exemplary embodiments of the invention.

FIG. 32C and FIG. 32D are sectional views taken along lines A—A' and B—B' in FIG. 32A and FIG. 32B, respectively.

FIG. 33A-F, FIG. 34A-F and FIG. 35A-C, are views for illustrating processes for manufacturing semiconductor memory devices according to other embodiments of the invention.

FIG. 36 and FIG. 37 are plan views of semiconductor memory devices according to still further embodiments of the invention.

DESCRIPTION OF THE PREFERRED EMBODIMENTS

Figure 1B:
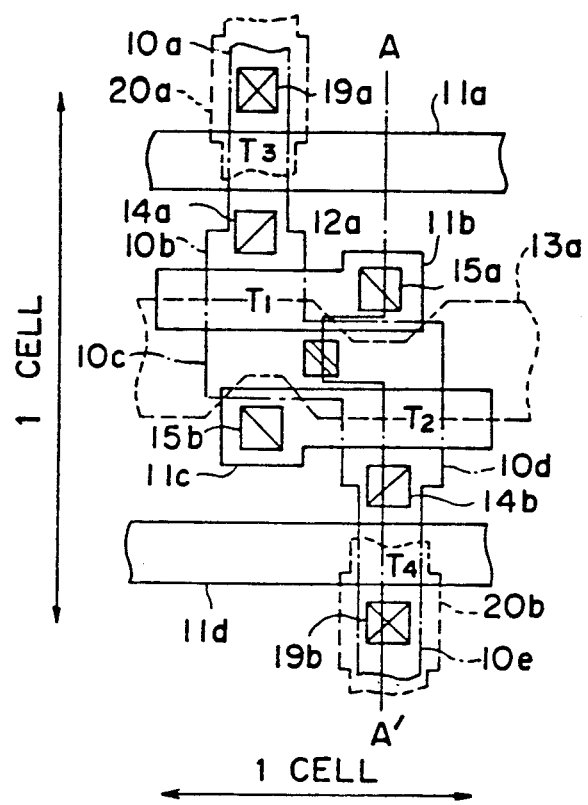

In the following, the present invention will be described in detail in conjunction with preferred exemplary embodiments thereof, wherein the embodiments 1 to 17 are directed to the basic embodiments of the invention, and embodiments 18 to 22 are concerned with the embodiments in which asymmetric MOS transistors are employed. Accordingly, the embodiments 18 to 22 are based on the presumption that they are combined with the embodiments 1 to 17.

In FIG. 1A to FIG. 30 which are referred to in the following description, denotations of reference numerals or reference symbols are as mentioned below.

Reference numerals 1 and 1' denote data lines, respectively, 2 denotes a word line, 3a, 3b, 3c, 3d, 3e, 3f, 3g, 3g', 10c', 10d', 37a, 37b, 37c, 37d, 48a, 48b, 48c, 48d, 48e and 48f denote highly concentrated n-type impurity regions, respectively, 4a, 4b, 4c, 6a, 6b, 8a, 8b, 12a, 14, 14a, 14a', 14b, 14b', 15a, 15a', 15b, 15b', 17a, 17b, 19a, 19b, 33a, 33b, 39a, 39b, 41a, 41b, 41c, 41d, 43a, 43b, 45a, 45b, 51a, 51b, 53a, 55a, 55b, 57a, 57b, 57c, 57d, 63a and 63b denote holes for interconnection, respectively, 5a, 5b, 5c, 5d, 5d', 5e, 5e', 11, 11a, 11b, 11c, 11d, 38a, 38b, 38c, 38d, 49a and 49b denote gate electrodes (first level polysilicon films), respectively, 7a, 7b and 7e denote second level low resistive polysilicon films, respectively, 7c and 7d denote second level high resistive polysilicon films, respectively, 9a, 9b, 20a, 20b, 46a, 46b, 58a and 58b denote data lines (first level aluminum electrode), respectively, 20b', 62a, 62b and 62c denote first level aluminum electrodes, respectively, 13a, 13b and 40a denote grounded wirings (second level polysilicon layers), respectively, 16a, 16b, 42a, 42b, 54a' and 54b' denote polysilicon PMOS gate electrodes serving also for interconnections (third level polysilicon films), respectively, 18a, 18b, 44a, 44c, 56a' and 56d' denote polysilicon PMOS drain regions (fourth level polysilicon films), respectively, 18c, 18d, 44b, 44d, 56b', 56e' and 72d denote polysilicon PMOS channel regions (fourth level polysilicon films), respectively, 18e, 44e, 56c', 56f and 72e denote polysilicon PMOS source regions (fourth level polysilicon films), respectively, 21 denotes an n-type silicon substrate, 22 denotes a p-type well, 23 and 23' denote field oxide films, respectively, 24 and 24' denote gate oxide films, respectively, 25 and 25' denote spacer insulation films, respectively, 26, 26', 31 and 68 denote insulation films, respectively, 27, 28, 30, 59 and 70 denote silicon oxide films, respectively, 29 and 29' polysilicon PMOS gate insulation films, respectively, 32a and 32b denote polysilicon PMOS gate electrodes also serving as interconnections (second level polysilicon films), respectively, 34a and 34b denote polysilicon PMOS drain regions (third level polysilicon films), respectively, 34c and 34d denote polysilicon PMOS channel regions (third level polysilicon films), respectively, 34e denotes a polysilicon PMOS source region (third level polysilicon film), 35 denotes a silicide layer, 36 denotes a low concentrated n-type impurity region, 47 denotes silicon oxide film, 50a and 50b denote gate electrodes (second level polysilicon films), respectively, 52a denotes a grounded wiring (third level polysilicon film), 54a and 54b denote polysilicon PMOS gate electrodes (fourth level polysilicon films), respectively, 56a and 56d denote polysilicon PMOS drain regions (fifth level polysilicon films), respectively, 56b and 56e denote polysilicon PMOS channel regions (fifth level polysilicon films), respectively, 56c and 56f denote polysilicon PMOS source regions (fifth level polysilicon films), respectively, 60 denotes a plug of tungsten, 61a and 61b denote fifth level n-type polysilicon films, respectively, 64a, 64b and 71b denote second level aluminum electrodes (data lines), respectively, 65 denotes a p-type silicon substrate, 66 denotes an n-type well, 67 denotes an n-type buried polysilicon, 69 denotes an n-type well of twin wells, 13c denotes a second level n-type polysilicon film, 73 denotes a silicide film, 142a and 142b denote third level n-type polysilicon film, respectively, 144a and 144c denote fourth level n-type low resistive polysilicon films, respectively, 144b and 144d denote fourth highly resistive polysilicon films, respectively, 144e denotes a wiring for power supply (fourth level polysilicon film), 10 denotes an active region, and a numeral 74 denotes a photoresist.

Embodiment 1

Figure 1C:
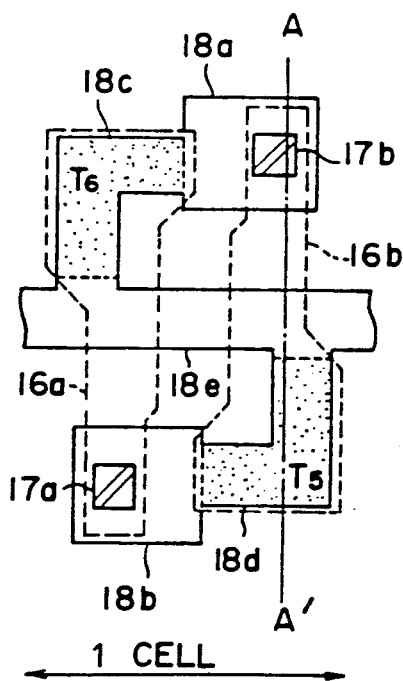
Figure 1D:
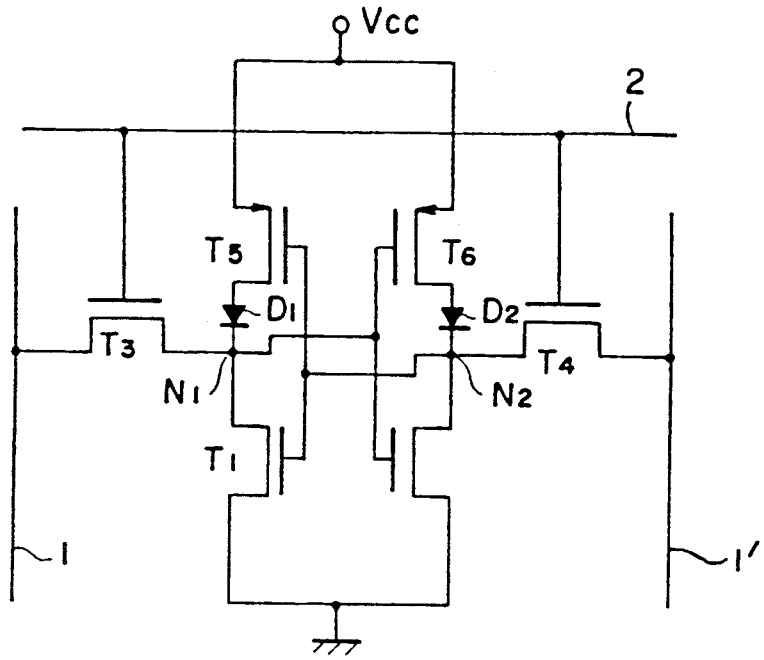
FIG. 1D and FIG. 11 are equivalent circuit diagrams of other embodiments of the invention.
Figure 2:
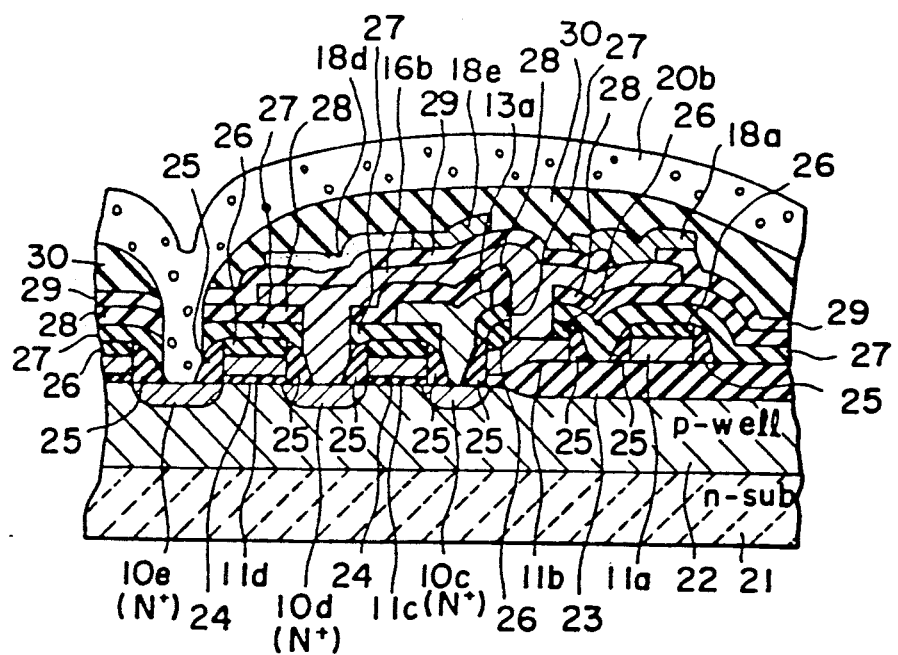
Figure 3:
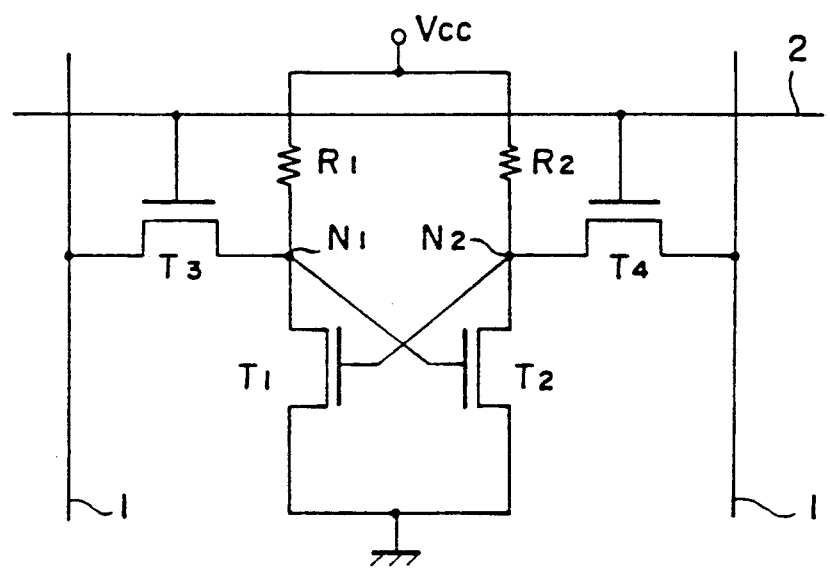
FIG. 3 is an equivalent circuit diagram for illustrating the problems of the prior art technique.
Figure 4:
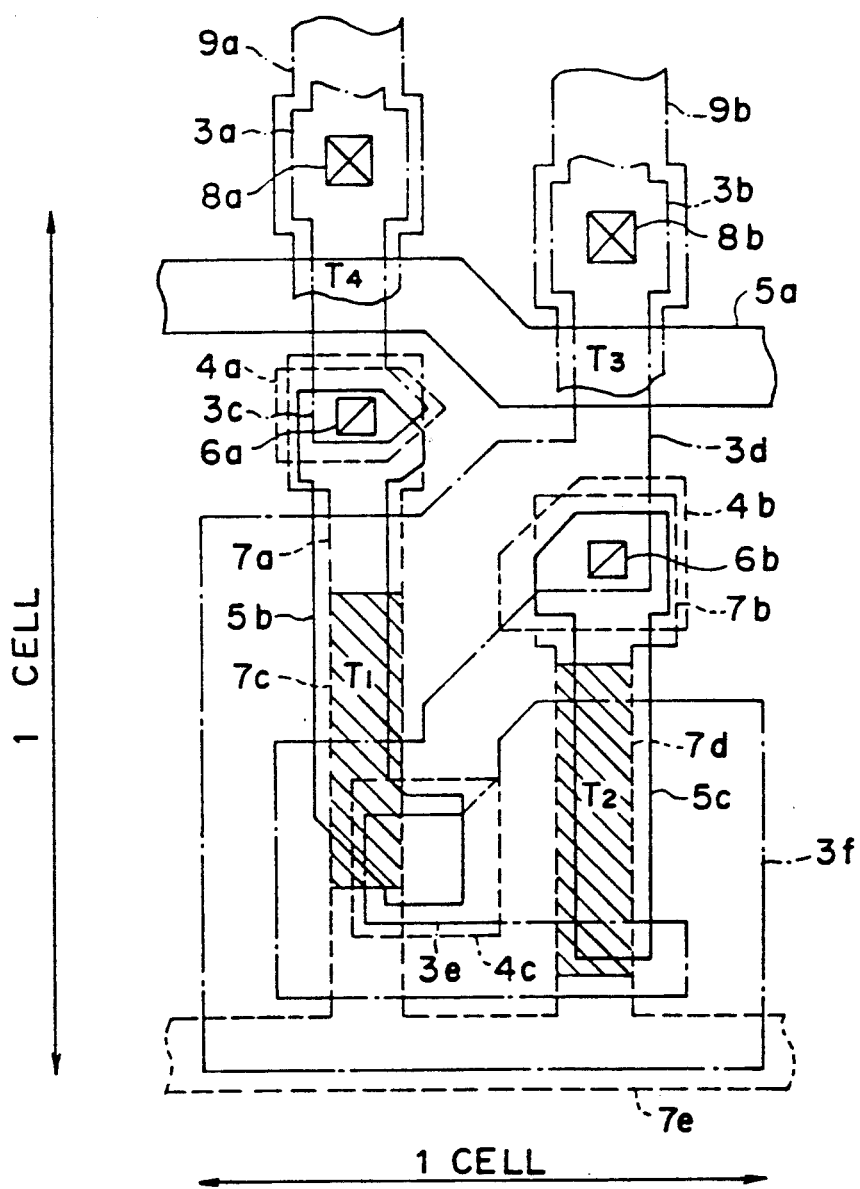
FIG. 4 and FIG. 5A-B are plan views for illustrating problems of the prior art technique.
Figure 5A:
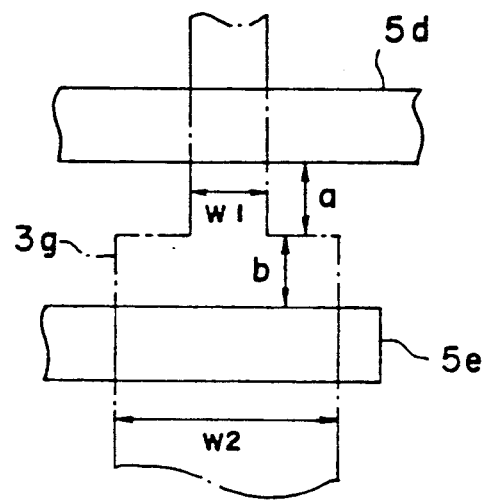
Figure 5B:
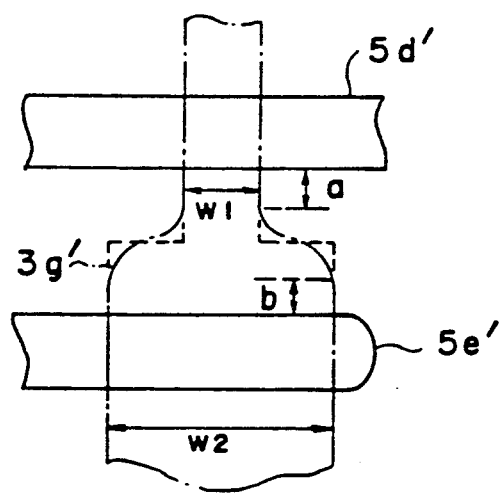

FIG. 1A, 1B and 1C are plan views showing a static random access memory cell according to a first exemplary embodiment of the invention, in which FIG. 1A shows a portion of the memory cell corresponding to 9 bits and including an active region 10, a gate electrode 11 and a hole 14 for interconnection, wherein the active region 10 except that for the gate electrode 11 is formed as a highly concentrated n-type impurity region. FIGS. 1B and 1C show in detail a portion of the memory cell shown in FIG. 1A and corresponding to a single bit. An equivalent circuit of the static random access memory cell according to the instant (first) embodiment is shown in FIG. 1D. Further, a sectional structure of the same as viewed along the line A—A' in FIGS. 1B and 1C is shown in FIG. 2. The instant embodiment of the invention is directed to a static random access memory including flip-flop circuits each constituted by a pair of inverters implemented by using stacked complementary MOS transistors, wherein driver MOS transistors and transfer MOS transistors on a silicon substrate are disposed closely to each other for thereby reducing the areas of pn-junctions at the storage nodes, cross-coupling in the flip-flop circuit is realized by a polysilicon film of the second level, and wherein the polysilicon film of the second level is used as the gate electrodes for the stacked PMOS transistors. More specifically, referring to FIG. 1B, there are shown in a plan view the n-channel driver MOS transistors, the transfer MOS transistors and a portion of the grounded wiring, the word lines and the data line, while corresponding portions of the p-channel MOS transistors are shown in FIG. 1C. In FIG. 1B and 1C and FIG. 2, the n-channel driver MOS transistors $T_1$ and $T_2$ and the n-channel transfer MOS transistors $T_3$ and $T_4$ are formed in a p-type well (island region of p-type impurity) which in turn is formed in an n-type silicon substrate, wherein the gate electrodes 11a, 11b, 11c and 11d of these transistors are each formed of the first level polysilicon film doped with an n-type impurity. The driver MOS transistor $T_1$ and the transfer MOS transistor $T_3$ share in common a highly concentrated n-type impurity region 10b with the driver MOS transistor $T_2$ and the transfer MOS transistor $T_4$ sharing in common a highly concentrated n-type impurity region 10d to thereby form the storage nodes $N_1$ and $N_2$, respectively, of the memory cell, as shown in FIG. 1D. In this conjunction, it is to be noted that the highly concentrated n-type impurity region 10b is disposed closely to the gate electrodes 11a and 11b so as to reduce the area of pn-junction automatically or in a self-aligning manner. Similarly, in the case of the highly concentrated n-type impurity region 10d, the pn-junction area is automatically reduced. Insulation films 26 are formed on the gate electrodes 11a, 11b, 11c and 11d, respectively, with spacer insulator films 25 being formed on the side walls. Polysilicon films 16a and 16b of the third level doped with an n-type impurity and the highly concentrated n-type impurity regions 10b and 10d are interrated connected through holes 14a and 14b formed in silicon oxide films 27 and 28, respectively, while being insulated automatically or in a self-aligning manner from the gate electrodes 11a, 11b, 11c and 11d. 16b of the third level are cross-coupled to the counterpart gate electrodes 11c and 11b, respectively, through the holes 15b and 15a for interconnection. Besides, at least portions of the polysilicon films 16a and 16b of the third level constitute, respectively, the gate electrodes of the stacked polysilicon PMOS transistors $T_6$ and $T_5$ shown in FIG. 1D, wherein the gate insulation films 29 of the polysilicon PMOS transistors $T_6$ and $T_5$ are formed at least on top portions of the polysilicon films 16a and 16b. Further, formed at least on the top portion of the gate insulation film 29 are polysilicon films of the fourth level which are destined to constitute channel regions 18c and 18d of the polysilicon PMOS transistors $T_6$ and $T_5$, respectively. Thus, the gate electrodes 16a and 16b of the polysilicon PMOS transistors $T_6$ and $T_5$ of the stacked structure are positioned underneath the channel regions 18c and 18d. The abovementioned polysilicon PMOS transistors $T_6$ and $T_5$ have respective drain regions 18a and 18b which are formed in the same level film as the channel regions 18c and 18d mentioned above, i.e. in the polysilicon film of the fourth level, wherein the drain regions 18a and 18b are connected to the gate electrodes 16b and 16a of the counterpart polysilicon PMOS transistors through the holes 17b and 17a, respectively, to thereby realize the cross-coupling in the flip-flop circuit.

On the other hand, a common source region 18e of the stacked polysilicon PMOS transistors $T_6$ and $T_5$ is formed in the fourth level polysilicon film similarly to the channel regions 18c and 18d to constitute a common power supply line in the memory for supplying a constant voltage to the sources of all the polysilicon PMOS transistors incorporated in the memory. The highly concentrated n-type impurity region 10c which is to serve as a common source of the driver MOS transistors $T_1$ and $T_2$ is insulated automatically or in a self-aligning manner from the gate electrodes 11b and 11c through the insulation film 26 overlying the gate electrodes 11b and 11c and the spacer insulation film 25, as in the case of the holes 14a and 14b for interconnection, while the grounded wiring 13a formed of the second level polysilicon film is connected to the highly concentrated n-type impurity region 10c mentioned above through the hole 12a. Thus, the source potential of all the driver MOS transistors incorporated in the memory are fixed to the ground potential.

It should be mentioned that the gate electrodes 11a and 11d of the transfer MOS transistors $T_3$ and $T_4$ constitute the word line, wherein there are connected to the highly concentrated n-type impurity regions 10a and 10e which are the active regions the aluminum electrodes 20a and 20b which are to serve as the data lines 1 and 1' of the memory cell through the holes 19a and 19b formed in silicon oxide films 27 and 28 and the gate insulation film 29 of the polysilicon PMOS transistor.

It should further be added that although the gate electrodes 11a, 11b, 11c and 11d of the driver MOS transistors $T_1$ and $T_2$ are formed of the polysilicon film doped with an n-type impurity, they may be formed of a film of a low resistive refractory metal such as tungsten, molybdenum, titanium or the like or a compound (silicide) of silicon and the refractory metal mentioned above or a composite film (polycide) of polysilicon and silicide. The gate electrodes 16b and 11c should preferably be doped with n-type impurity at a high concentration. In particular, at least the polysilicon films 16a and 16b of the third level which are connected to the abovementioned gate electrodes should preferably be doped with n-type impurity at a high concentration. Further, the polysilicon films 16a and 16b of the third level need not necessarily be of polysilicon but may be of a low resistive refractory metal or a silicon compound thereof (silicide) or a composite film of polysilicon and silicide (polycide). It should additionally be mentioned that the gate electrodes 11b and 11c need not necessarily be doped with n-type impurity at a high concentration but may be doped with a p-type impurity, provided that the three level polysilicon films 16a and 16b are formed of a film having a low diffusibility or a small diffusion coefficient such as a titanium nitride (TiN) film, a composite film thereof or the like.

In the static random access memory of the structure in which the complementary MOS (CMOS) transistors are employed, as described above, there are formed the pn-junctions $D_1$ and $D_2$ having noticeable current leakage indicated in the equivalent circuit diagram of FIG. 1D, as is well known in the art, which however gives rise to no problems in operation of the circuit.

Next, description will be made of a method of manufacturing the static random access memory cell according to the instant embodiment of the invention by referring to FIGS. 6A to 6G which show manufacturing steps in sections taken along the line A—A' in the top plan views of FIGS. 1B and 1C. In the case of the instant embodiment, the MOS transistors employed in the memory cell and formed on the surface of the silicon substrate are all implemented as the n-channel MOS transistors formed in the p-type well 22, wherein the peripheral circuit of the memory is constituted by a complementary MOS (CMOS) circuit formed in double wells. It should, however, be understood that the memory peripheral circuit may be of a single well structure of p- or n-type. Alternatively, in order to make it possible to supply a plurality of source voltages to the memory peripheral circuit, the memory peripheral circuit may be of a multi-well structure including three or more types of wells in which the well having the same conductivity type as the substrate is surrounded by another well having the conductivity type opposite to that of the substrate so that the former is electrically isolated from the substrate. Further, the substrate may also be either of n-type or p-type. The following description is directed to only the process or steps of manufacturing the memory cell part, it being understood that the method of manufacturing the peripheral CMOS circuit can be carried out by resorting to techniques known in the art.

Figure 6A:
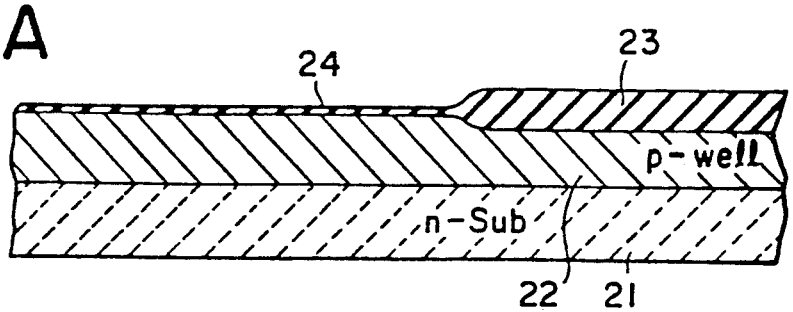
Figure 6B:
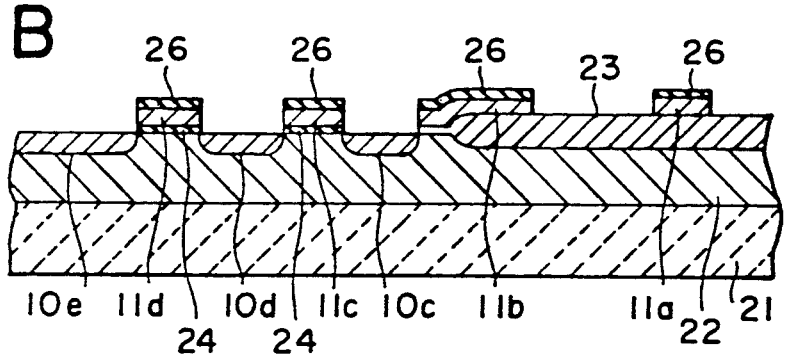
Figure 6C:
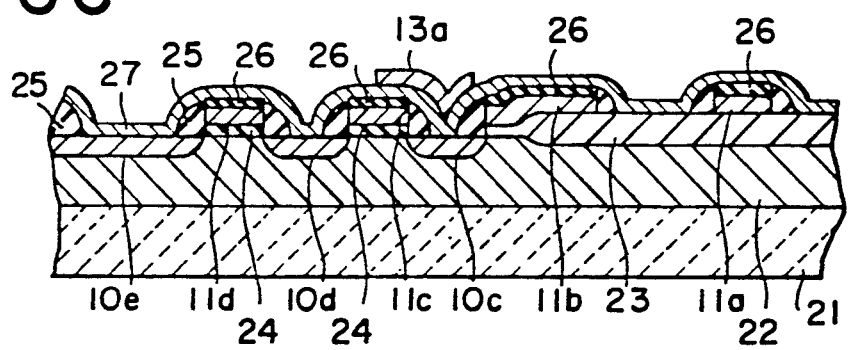
Figure 6D:
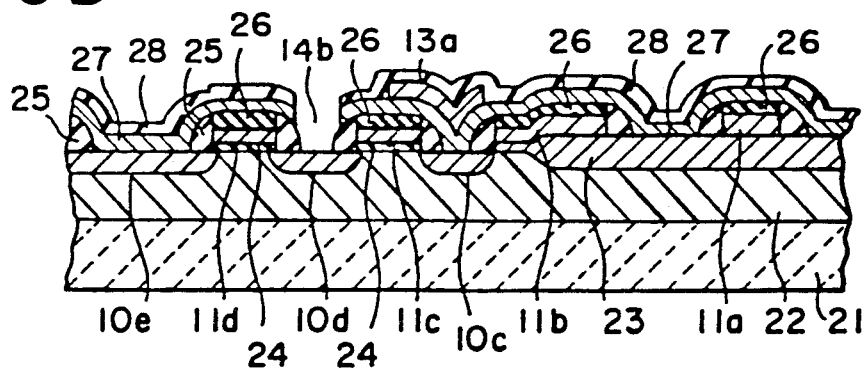
Figure 6E:
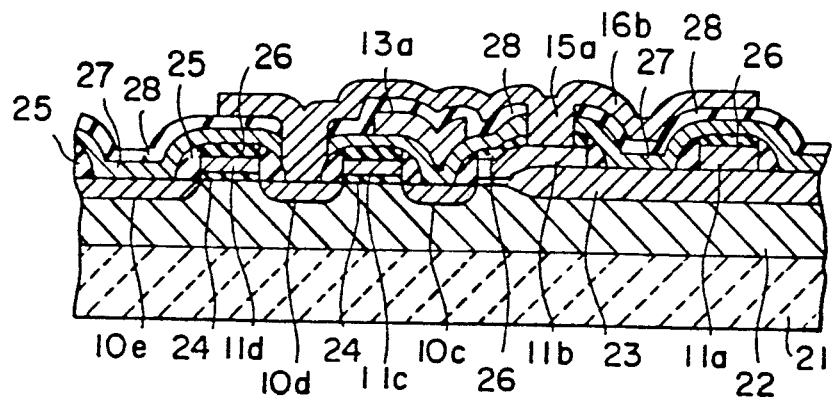
Figure 6F:
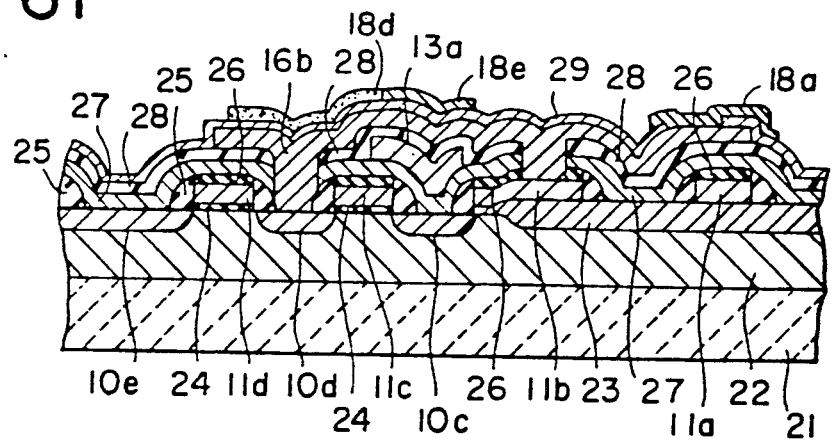
Figure 6G:
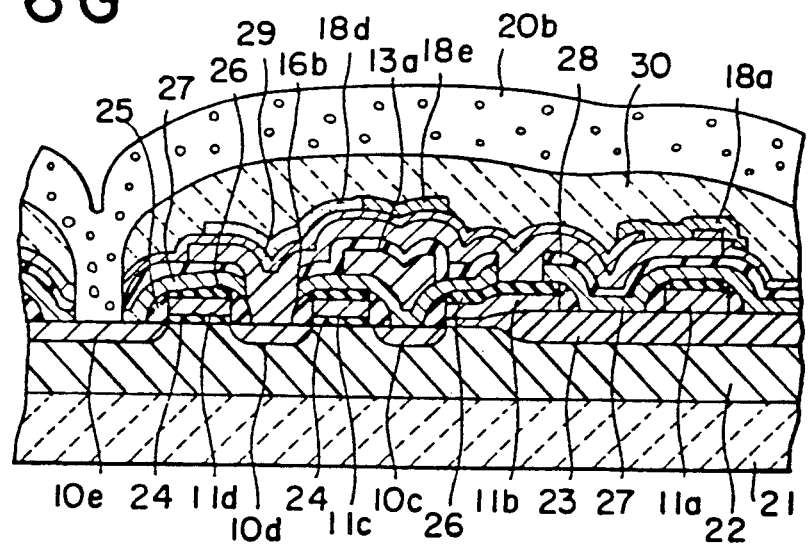

At first, a p-type well 22 having a depth of 2 to 3 $\mu$m and an impurity concentration of $10^{16}$ cm$^{-3}$ to $10^{17}$ cm$^{-3}$ is formed in an n-type silicon substrate 21 having a specific resistance of about 10 $\Omega$·cm through a known process by a boron ion implantation method and a thermal diffusion method. Thereafter, a p-type channel stopper layer and a silicon oxide film (field oxide film) 23 having a thickness in a range of 300 to 500 nm for element isolation are formed by local oxidation of silicon, which is then followed by formation of a gate oxide film 24 of about 5 to 20 nm in thickness at a region which is to constitute the active region of the MOS transistor. In forming the field oxide film 23, it is a common practice to form a channel stopper layer in the p-type well 22 beneath the field oxide film 23 for preventing the latter from forming an n-type inversion layer. In this connection, it should be noted that formation of such a channel stopper layer is omitted from illustration in the drawing. Further, impurity distribution within the well may be such that the concentration of impurity is increased as the depth increases. In that case, energy for the ion implantation for forming the p-type well is correspondingly varied (i.e. assumes a plurality of levels). The structure thus realized is shown in FIG. 6A. Next, after ion implantation for adjusting the threshold voltage of the MOS transistor, a polysilicon film 11 of 200 nm in thickness is deposited by a low pressure chemical vapor deposition method (LPCVD method), and an n-type impurity such as phosphorus is introduced in the polysilicon film 11 by a gas-phase drive-in method. Subsequently, an insulator film 26 such as a silicon nitride film or the like is deposited in a thickness of 200 nm by the LPCVD method, which is then followed by patterning of the insulator film 26 and the polysilicon film 11 into the gate electrodes 11a to 11d by photolithography and dry etching. By using these gate electrodes as a mask for ion implantation, ion implantation of n-type impurity ions such as arsenic ions (As) or the like is carried out in a dose on the order of $10^{15}$ cm$^{-2}$. Thereafter, an anneal operation is performed in the nitriding atmosphere to thereby form the highly concentrated n-type impurity regions 10a to 10e having a depth of 0.1 to 0.2 $\mu$m. It is desirable that the thickness of the gate electrodes 11a to 11d and the insulator film 26 such as the silicon nitride film or the like formed thereon should be optimized by taking into consideration the desired size and the conditions for the dry-etching. Although the insulation film 26 may be formed by a silicon oxide film, other film such as a tantalum film (Ta$_2$O$_5$) having a lower etching rate than the silicon oxide film is more suitable as the insulator film 26. The doping of polysilicon with the impurity for forming the gate electrode may be accomplished not only by the ion implantation method but also by the drive-in method carried out in forming the polysilicon film (FIG. 6B). Subsequently, after deposition of a silicon oxide film of 200 to 400 nm in thickness by the LPCVD method, the silicon oxide film is etched by an anisotropic dry-etching method to form the spacer insulation films on the side walls of the gate electrodes 11a to 11d. Thereafter, a silicon oxide film 27 of 100 nm in thickness is deposited by the LPCVD method. Then, holes for interconnection (12a in FIG. 1A) are formed in the abovementioned silicon oxide film 27 by photolithography and dry-etching. Subsequently, the second level polysilicon film 13a is deposited in a thickness of 100 nm, wherein an n-type impurity such as arsenic or the like is introduced with a concentration in a range of $10^{19}$ cm$^{-3}$ to $10^{30}$ cm$^{-3}$ by the ion implantation method or the like, which is then followed by patterning of the second level polysilicon film 13a in the form of the grounded wiring 13a by photolithography or dry-etching. It should be mentioned that the spacer insulation film 25 may also be a silicon oxide or other insulation film, as in the case of the insulation film 26. Further, because of the presence or the spacer insulation films 25 on the side walls of gate electrodes 11b and 11c and the insulator films 26 on the tops thereof upon forming the abovementioned hole 12a, the gate electrodes 11b and 11c can be insulated automatically in a self-alignment manner relative to the hole provided that the conditions for the dry-etching are established appropriately. In that case, the connecting hole 12a and the gate electrodes 11b and 11c can be disposed closely adjacent to each other, whereby the area of the memory cell can be reduced correspondingly. The grounded wiring 13a should preferably be formed of a low resistive material such as a tungsten silicide film, polycide film or the like (FIG. 6C). Next, a silicon film 28 is deposited in a thickness of 100 nm by the LPCVD method, wherein the hole 14b for interconnection is formed in the silicon oxide films 27 and 28 overlying the highly concentrated n-type impurity region 10d by photolithography and dry-etching. In that case, the spacer insulation films 25 on the side walls of the gate electrodes 11c and 11d and the insulation film 26 on the tops thereof allow the gate electrodes 11c and 11d to be insulated from the hole 14b automatically in a self-aligning manner when the condition for the dry etching is established appropriately (FIG. 6D). Next, the hole 15a for interconnection is formed on the insulator film 25 and the silicon oxide films 27 and 28 overlying the gate electrode 11b by photolithography and dry etching, and then a polysilicon film 16b of the third level is deposited in a thickness of 100 nm by the LPCVD method, which is followed by the doping of the third level polysilicon film 16b with n-type impurity through implantation of arsenic ions with a dose of $5 \times 10^{15}$ cm$^{-2}$ at 80 KeV and a subsequent activation by the anneal as required. Thereafter, the third level polysilicon film 16b is imparted with a desired shape by photolithography and dry etching. In this conjunction, it is to be mentioned that a thin silicon oxide film should preferably be formed on the polysilicon film 16b before the ion implantation. Further, the dose for ion implantation and energy therefor should be selected optimal in dependence on the thickness of the polysilicon film 16b. It should also be added that the hole 14b for interconnection opened at the preceding step (FIG. 6D) and the hole 15a formed at the instant step may be realized through one and same photolithography and dry etching process. In that case, the number of manufacturing steps can be decreased correspondingly (FIG. 6E). Additionally, an insulation film 29 such as a silicon oxide film is deposited in a thickness of 10 to 50 nm by the LPCVD method and then annealed about 10 minutes at 900° C. in the atmosphere of nitrogen. Subsequently, the holes 17a and 17b shown in FIG. 1C are opened in the insulation film 29 by photolithography and dry etching and then a polysilicon film 18 of the fourth level is deposited in a thickness of 10 to 50 nm by the LPCVD method, whereon the polysilicon film 18 is imparted with a desired shape by photolithography and dry etching. Next, after a silicon oxide film is formed on the abovementioned polysilicon film 18 in a thickness of 5 nm, a photoresist is formed on a region which is to constitute the channel region 18d of the polysilicon PMOS transistor by photolithography, and then implantation of BF$_2$-ions is performed with a dose of $10^{14}$ cm$^{-2}$ to $10^{15}$ cm$^{-2}$ by using the photoresist. After removing the photoresist, anneal is performed about 10 minutes at 850° C. in the atmosphere of nitrogen to activate the impurity ions to thereby form the source region 18e, the drain region 18a and the channel region 18d, respectively, of the polysilicon PMOS transistor. It should be noted that the gate insulation film 29 of the polysilicon PMOS transistor may also be formed by oxidizing the polysilicon film 18b. Further, the gate insulation film 29 may be formed of an insulation film having a higher specific dielectric constant than the other silicon oxide films such as a silicon nitride film, a composite film of silicon nitride and silicon oxide films or the like. Additionally, the ion implantation for forming the source, drain and channel regions of the polysilicon PMOS transistor may be carried out before the patterning of the fourth level polysilicon film. Further, it is sufficient that the gate insulation film 29 of the polysilicon PMOS transistor underlies at least the fourth level polysilicon films 18a, 18d and 18e. Accordingly, the other portion of the insulation film 29 than those underlying the fourth level polysilicon films may be removed by etching. The BF2-ion implantation for forming the source and drain regions of the polysilicon PMOS transistor may be performed with an ion implantation dose not exceeding $10^{14}$ cm$^{-2}$ for thereby reducing the current leakage between the source and the drain. In that case, the ion-implanted portion may be converted to a silicide layer by using a refractory metal such as tungsten in order to reduce the resistivity of the source and the drain. Next, a composite silicon oxide film 30 including a silicon oxide film having a thickness of 100 nm and a silicon oxide film containing, for example, phosphorus and having a thickness of 300 nm is deposited for smoothing out offset portions in the memory cell, a hole 19b for interconnection is opened, an aluminum film is deposited in a thickness of about 1 μm by sputtering and then an aluminum electrode 206 is patterned by photolithography and dry etching (FIG. 6F). Finally, a passivation process and a package process are carried out, whereupon the memory cell is completed. As to the electrode wiring material, tungsten or the like may also be employed.

Embodiment 2

Figure 8A:
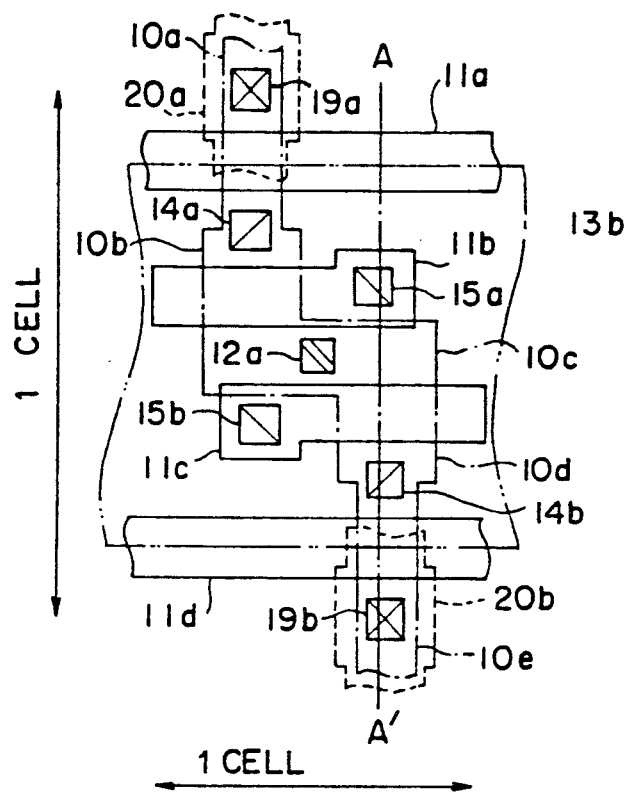
Figure 8B:
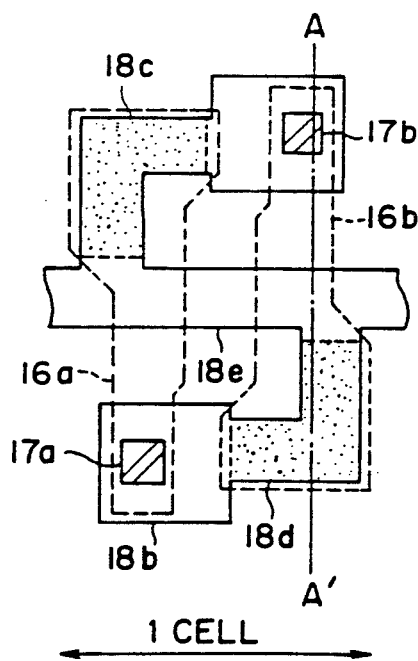
Figure 9:
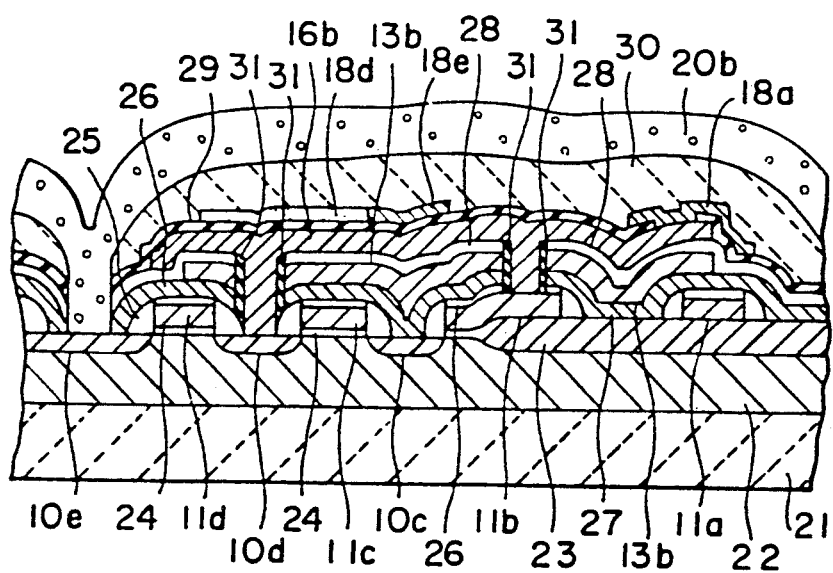
Figure 10A:
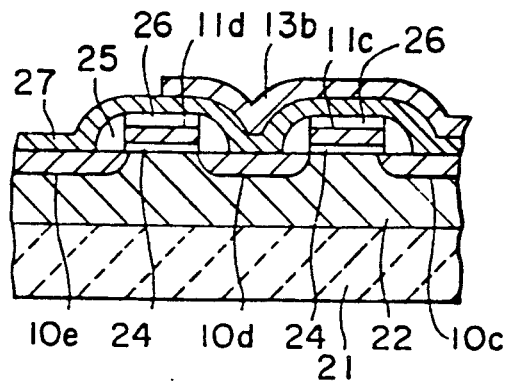
Figure 10B:
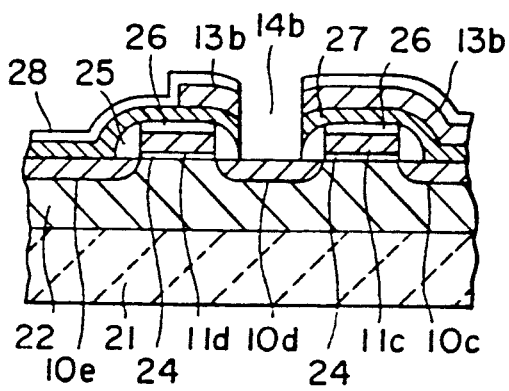
Figure 10C:
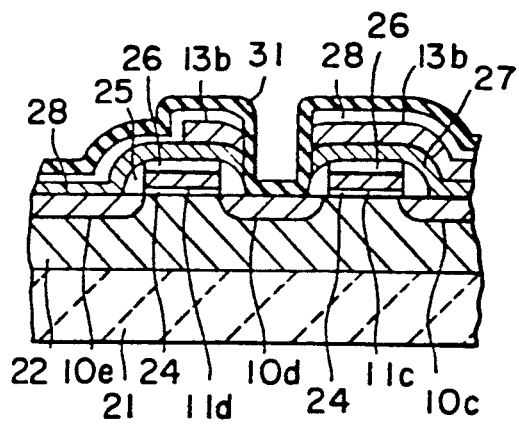
Figure 10D:
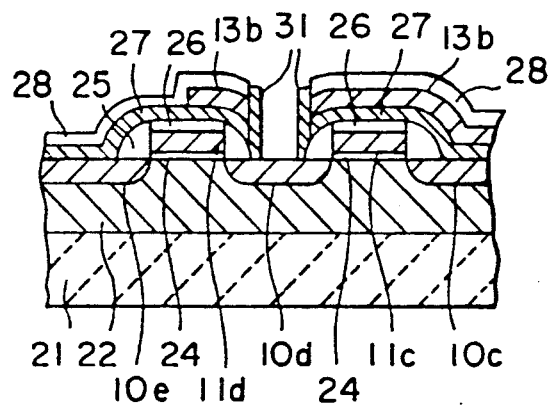
Figure 10E:
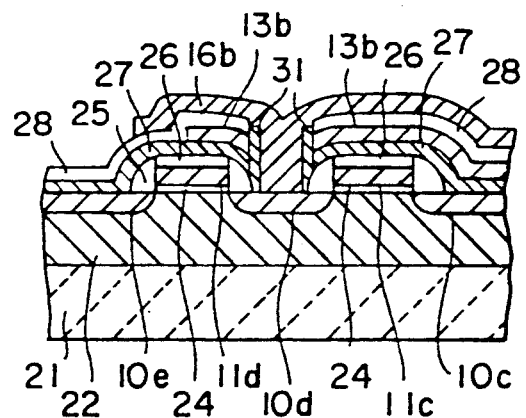

The instant embodiment 2 is concerned with a method of increasing the area for the grounded wiring automatically in a self-aligning manner in the static random access memory cell described above in conjunction with the embodiment 1. FIGS. 8A and 8B are plan views showing a static random access memory according to the second exemplary embodiment of the invention and correspond to FIGS. 1A and 1B, respectively. FIG. 9 is a sectional view showing a structure taken along a line A—A' in FIG. 8. Referring to FIGS. 8 and 9, there are connected to the highly concentrated n-type impurity regions 10b and 10d constituting the storage nodes in the flip-flop circuit of the memory cell the polysilicon films 16a and 16b of the third level insulated automatically in a self-aligning manner relative to a polysilicon film 13b of the second level constituting the grounded wiring. Consequently, the second level polysilicon film 13b can be disposed independent of the positions of the holes 14a; 14b and 15a; 15b, thereby area for the grounded wiring can be increased. The instant embodiment will be described in more detail by reference to FIGS. 10A to 10E which show in sectional views the manufacturing steps at which the polysilicon films of the second and third levels are automatically insulated in a self-aligning manner. The steps up to the formation of the n-channel MOS transistor and the grounded wiring 13b on the n-type silicon substrate 21 are utterly same as the steps described hereinbefore in conjunction with the embodiment 1 and illustrated in FIGS. 6A to 6C except difference in the patterned shape of the grounded wiring or the second level polysilicon film (FIG. 10A). Subsequently, after deposition of a silicon oxide film 28 in a thickness of 100 nm by the LPCVD method, the hole 14b for interconnection is formed in the silicon oxide film 27, the second level polysilicon film and the silicon oxide film 28 overlying the highly concentrated n-type impurity region 10 by photolithography and dry etching (FIG. 10B). Next, an insulation film 31 such as a silicon nitride film is deposited in a thickness of 50 nm by the LPCVD method. The thickness of the insulation film 31 may be selected at an appropriate value in a range of 10 nm to 100 nm in accordance with the diameter of the hole 14b, thickness of the insulation film 26, the silicon oxide film 28 and others. Further, the insulation film 31 may also be formed of a silicon oxide film, a composite film of a silicon oxide film and a silicon nitride film and the like (FIG. 10C). Next, the insulation film 31 on the bottom surface of the hole 14b and the other portion than the hole 14b is etched by resorting to a dry etching exhibiting a high anisotropy such as reactive ion etching or the like so that only the abovementioned insulation film 31 remains on the side walls of the opened hole 14b, to thereby insulate the second level polysilicon film 13b in a self-aligning manner (FIG. 10D). The manufacturing steps succeeding to that of forming the third level polysilicon film (FIG. 10E) inclusive may be carried out in utterly the same manner as the corresponding steps described hereinbefore in conjunction with the embodiment 1.

Figure 11:
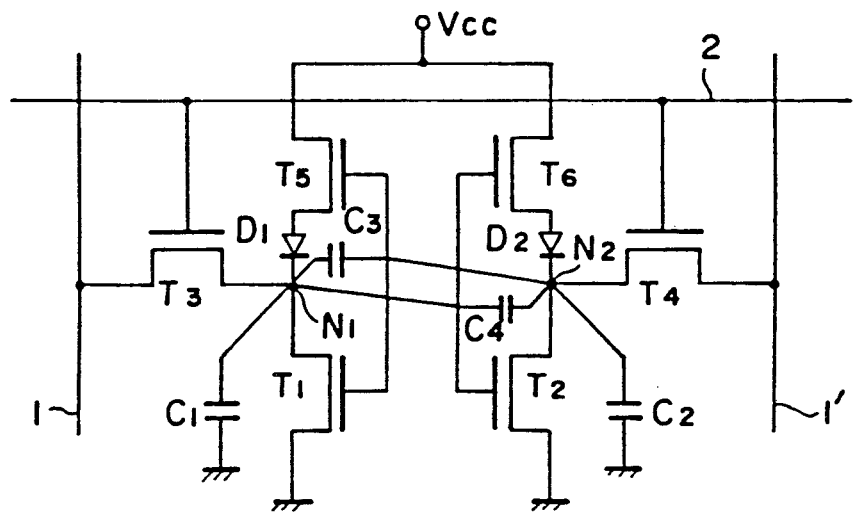

According to the instant embodiment, since the second level polysilicon film destined to serve as the grounded wiring and the third level polysilicon film destined to serve as the wiring for the gate electrode of the polysilicon PMOS transistor and the cross-coupling are automatically insulated in a self-aligning manner, the area of overlapping portions of the second level polysilicon film 13b and the third level polysilicon film 16b can effectively be increased or widened, which in turn makes it possible to form capacitor elements $C_1$ and $C_2$ of a large capacity between the storage nodes and the grounded potential, as is illustrated in FIG. 11, to advantage in that the soft-error ratio can be reduced in the extremely small static random access memory. Besides, it is possible to widen the area of the overlapping portions of the gate electrode 11c of the driver MOS transistor and the second level polysilicon film 13b, which in turn allows capacitor elements $C_3$ and $C_4$ to be formed, as can be seen in FIG. 11, wherein these capacitor elements also contribute to reduction of the soft-error ratio of the extremely small static random access memory similarly to the capacitor elements $C_1$ and $C_2$. Parenthetically, the capacity of the abovementioned capacitor elements $C_1$, $C_2$, $C_3$ and $C_4$ can further be increased by forming the insulation films 26, 31 and the silicon oxide film 28 from materials having a greater specific dielectric constant than the silicon oxide film without need for increasing the area of the memory cell. As the material to this end, there can be mentioned, for example, a composite film of a silicon oxide film and a silicon nitride film, a tantalum oxide film and the like in addition to the silicon nitride film.

Furthermore, according to the instant embodiment of the invention, the wiring width for the grounded wiring 13b can be broadened without increasing the area of the memory cell. Thus, in conjunction with the supply of the ground potential to the source of the driver MOS transistor in the memory cell shown in FIG. 11, it is possible to stabilize the ground potential even when a large current flows to the memory cell, which is advantageous in that the memory cell can be protected against the erroneous operation even under the influence of noise or the like as brought about by lowering of the power supply voltage on the voltages supply wiring.

It should further be added that the ground potential wiring method incarnated in the instant embodiment can equally be applied to the devices having the grounded wiring structures in which other polysilicons are made use of.

Embodiment 3

Figure 12A:
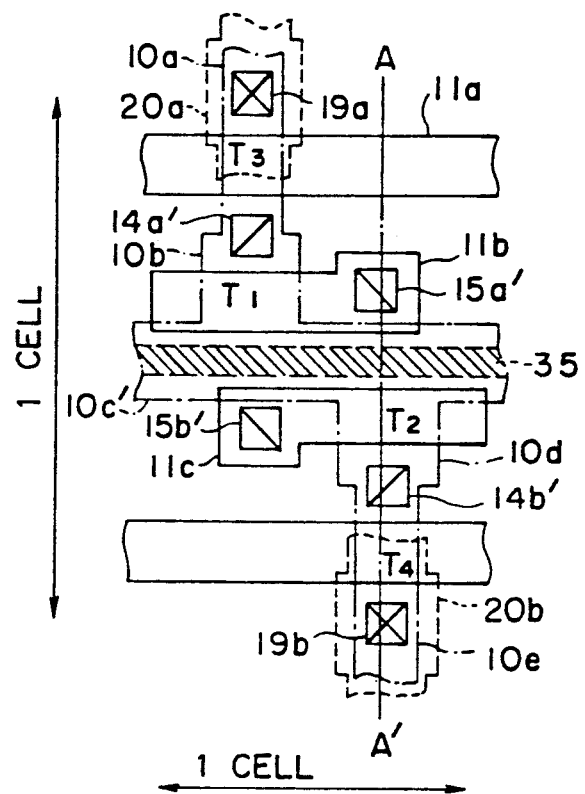
Figure 12B:
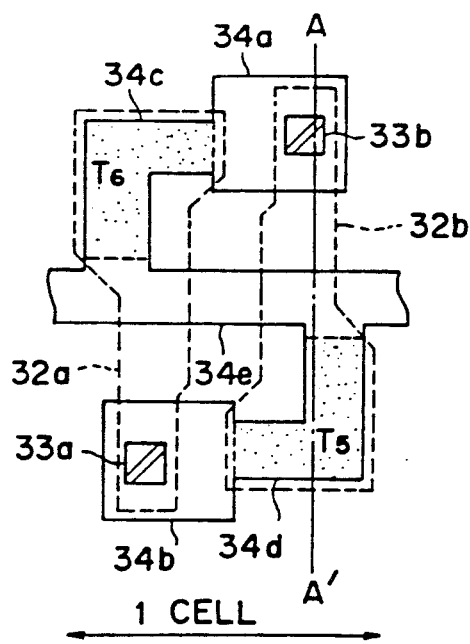

This exemplary embodiment is directed to a static random access memory cell described hereinbefore in conjunction with the embodiment 1 in which however a highly concentrated n-type impurity region is employed for the wiring of the grounded potential line. FIGS. 12A and 12B are views showing a planer structure of the static random access memory cell according to the instant embodiment of the invention, wherein FIG. 12A shows portions of the driver and transfer MOS transistors, the grounded wiring and the data line as in the case of the embodiment 1, while FIG. 12B shows a portion of the polysilicon PMOS transistor. Further, FIG. 13 is a view showing a sectional structure taken along the line A—A' in FIG. 12. Referring to FIGS. 12 and 13, a highly concentrated n-type impurity region $10c'$ serves as a source common to two driver MOS transistors $T_1$ and $T_2$ incorporated in the memory cell and at the same time is employed as a common grounded wiring in the memory for supplying the ground potential to the sources of the driver MOS transistors of the individual memory cells. Further, highly-concentrated n-type impurity regions $10b$ and $10d$ forming the store nodes in the flip-flop circuit of the memory cell are of the embodiment 1, wherein holes $14a'$ and $14b'$ for interconnection are opened in the highly concentrated n-type impurity regions $10b$ and $10d$ to which polysilicon films $32a$ and $32b$ of the second level are connected to serve as the gate electrodes of the polysilicon PMOS transistors $T_6$ and $T_5$, respectively, wherein the second level polysilicon films $32a$ and $32b$ are connected to the gate electrodes $11c$ and $11b$ of the counterpart driver MOS transistors of the flip-flop circuit by way of the interconnecting holes $15b'$ and $15a'$ to thereby realize the cross-coupling. Additionally, holes $32a$ and $32b$ for interconnection are opened in the second level polysilicon films $32a$ and $32b$ mentioned above, through which high polysilicon films $34b$ and $34a$ of the third level destined to constitute the drain regions of the polysilicon PMOS transistors $T_5$ and $T_6$ are interconnected to realize a cross coupling in the flip-flop circuit. A polysilicon film $34e$ of the third level to serve as the source common to the abovementioned polysilicon PMOS transistors $T_5$ and $T_6$ constitutes a power supply wiring common to the individual memory cells. Besides, third level polysilicon films $34c$ and $34d$ destined to constitute the channel regions of the abovementioned polysilicon PMOS transistors $T_5$ and $T_6$ are disposed on the second level polysilicon films $32a$ and $32b$ with interposition of an insulation film $29'$. When the highly concentrated impurity region $10c'$ is to be employed as the grounded wiring, as in the case of the instant embodiment, it is possible to reduce sufficiently the resistance of the grounded wiring by forming a silicide layer 35 of a refractory metal such as tungsten, titanium or the like as a part of the highly concentrated n-type impurity region $10'$, to thereby ensure protection of the memory cell against erroneous operation.

According to the instant embodiment, the level number of the polysilicon films can be reduced, thereby offset portions of the memory cell can correspondingly be mitigated, which in turn contributes to reduction in the number of the manufacturing steps and improvement of the manufacturing yield.

Embodiment 4

This embodiment is concerned with a static random access memory cell described hereinbefore in conjunction with the embodiment 1 in which n-channel MOS transistors formed on the silicon substrate are implemented in a LDD (Lightly Doped Drain) structure known in the art. FIG. 14 is a view showing in a section the structure of the static random access memory cell according to the instant embodiment. Referring to the figure, there is formed in a self-aligning manner at the source and drain ends of the n-channel MOS transistor formed on a surface of the silicon substrate 21 an n-type impurity region 36 having a low concentration of $10^{17}$ cm$^{-2}$ to $10^{18}$ cm$^{-2}$. In other words, the highly concentrated n type impurity regions $10c$, $10d$ and $10e$ mentioned hereinbefore are so formed in a self-aligning manner that the area of pn-junction becomes extremely small by using the spacer insulation film 25 as a mask for ion implantation. Parenthetically, a known manufacturing method may be resorted to for implementing the MOS transistor of the LDD structure. It should further be mentioned that the low concentrated n-type impurity region need not necessarily be formed in the source region of the driver MOS transistor, as will be described in more detail later in conjunction with the exemplary embodiments 8 to 12.

According to the instant embodiment, the performance of the n-channel MOS transistor formed on the silicon substrate surface can be maintained over an extended period without suffering deviations, whereby erroneous operation of the static random access memory device can be prevented positively.

The teaching of the invention incarnated in the instant embodiment can be applied to all the insulated gate field effect transistors formed on the silicon substrate in the other embodiments of the invention.

Embodiment 5

Figure 15A:
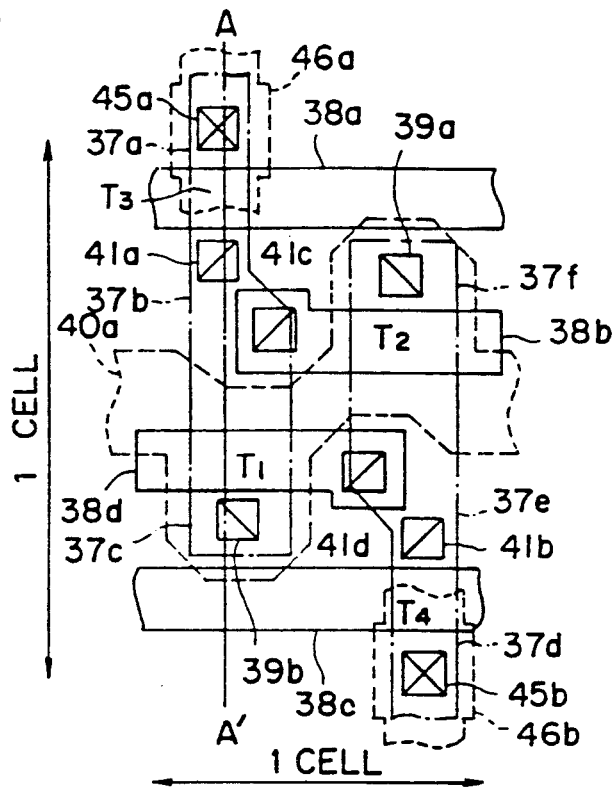
Figure 15B:
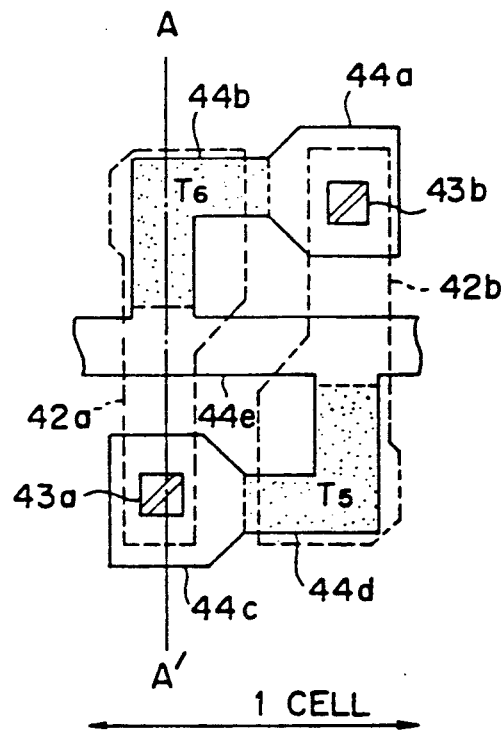

The instant embodiment is directed to a method for placement or disposition of the driving MOS transistor and the transfer MOS transistor in the static random access memory cell according to the embodiment i. FIGS. 15A and 15B illustrate in plan views a structure of the static random access memory cell according to the instant embodiment, wherein FIG. 15A shows a portion including driver and transfer MOS transistors, the grounded wiring and the data line, as in the case of the embodiment 1, and FIG. 15B shows a portion including a polysilicon MOS transistor. Referring to FIGS. 15A and 15B, there are connected to highly concentrated n-type impurity regions $37b$ and $37e$ constituting the store nodes in the flip-flop circuit of the memory cell through holes $41a$ and $41b$ for interconnection the polysilicon films $42a$ and $42b$ of the third level which also operate as the gate electrodes of the polysilicon PMOS transistor $T_6$ and $T_5$, respectively, and which are further connected to the gate electrodes $38b$ and $38d$ of the driver transistors $T_2$ and $T_1$, respectively, through the holes $41c$ and $41d$ to thereby form the cross coupling of the flip-flop circuit. Although it is assumed in the case of the instant embodiment that the holes $41a$ and $41c$ are formed at the same process step with the holes $41b$ and $41d$ being opened at the same step, the holes $41c$ and $41d$ may be formed at the different steps with the holes 41a and 41b being formed at the same step, as in the case of the first embodiment. Further, in place of opening the holes 41a and 41c separately, they can be realized in the single hole. The same holds true for the holes 41b and 41d. Connected to the highly concentrated n-type impurity regions 37c and 37f constituting the source regions of the driver MOS transistors $T_1$ and $T_2$ through the holes 39b and 39a is a polysilicon film 40a of the second level which also serves as the grounded wiring in the memory for supplying the ground potential to the sources of the driver MOS transistors of the individual memory cells.

According to the instant embodiment, the channel width of the driver MOS transistor can be made sufficiently greater than that of the transfer MOS transistors, which affords a broader range of supply voltage at which the static random access memory device can operate without suffering from erroneous operation due to the lowering of the supply voltage.

Embodiment 6

This embodiment is concerned with a method of reducing the area of pn-junction of the storage node in the flip-flop circuit of the static random access memory cell according to the preceding embodiment 5. FIG. 16 is a view showing in section a structure of the static random access memory cell according to the instant embodiment. Referring to FIG. 16, silicon oxide region 47 is formed underneath the highly concentrated n-type impurity region 37b which constitutes the storage node in the flip-flop circuit of the memory cell. Thus, the pn-junction formed by the highly concentrated impurity region 37b is located only on the side of that region 37b.

In a method of forming the abovementioned silicon oxide 47, oxygen ions are implanted only to the region destined to constitute the storage node in a dose of $10^{18}$ cm$^{-2}$ in such a projected range that ions are implanted to a depth of 0.2 to 0.3 $\mu$m from the surface of the silicon substrate, and then annealing is carried out at 1100° C. for two hours in the nitriding atmosphere. It should however be mentioned that the silicon oxide 47 may be formed over the whole memory region or alternatively over the memory region and the peripheral circuit region. It is preferred to form the silicon oxide 47 before forming the MOS transistor.

According to the instant embodiment, the area of the pn-junction of the storage node in the flip-flop circuit of the memory cell can be made extremely small. Consequently, the amount of electron-hole pairs produced by irradiation of $\alpha$-rays is reduced, whereby the static random access memory of super low power dissipation which enjoys extremely high immunity to soft error and erroneous operation due to lowering of the supply voltage can be realized with a high packing density.

Embodiment 7

Figure 18:
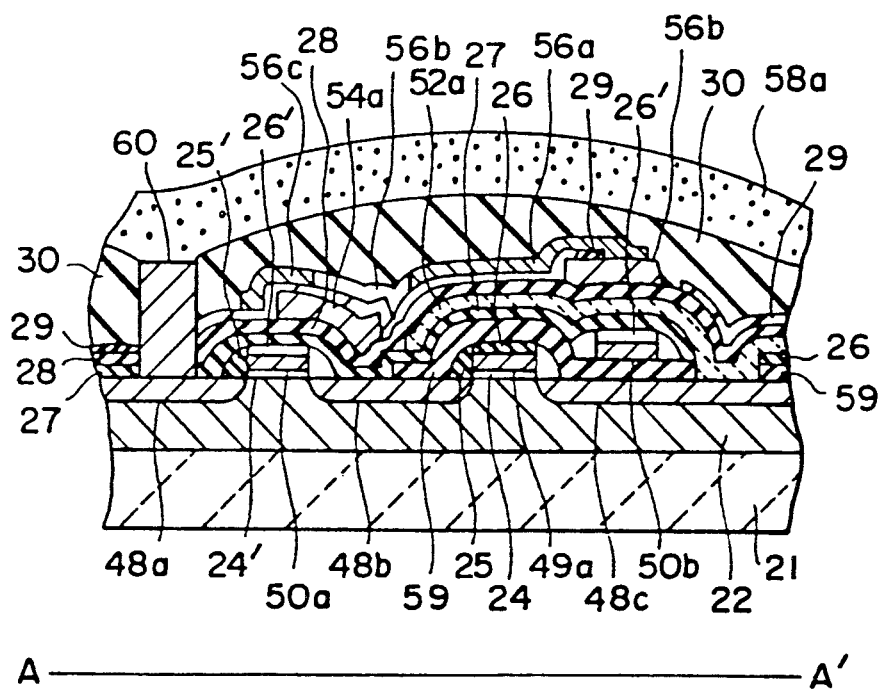

The instant embodiment is concerned with a modified structure of the static random access memory cell according to the first embodiment in which the gate electrode of the driver MOS transistor and that of the transfer MOS transistor are formed in different layers, respectively. FIGS. 17A and 17B are plan views showing a structure of the static random access memory cell according to the instant embodiment, and FIG. 18 shows the same in a sectional view taken along the line A—A' in FIGS. 17A and 17B. Referring to FIGS. 17 and 18, the gate electrodes 49a and 49b of the driver transistors $T_1$ and $T_2$ are each formed by a polysilicon film of the first level, while the gate electrodes 50a and 50b of the transfer MOS transistors $T_3$ and $T_4$ are each formed by a polysilicon film of the second level. The third level polysilicon film constitutes the grounded wiring 52a, and the fourth level n-type polysilicon films 54a and 54b constitute the gate electrodes of the polysilicon MOS transistors, wherein the gate electrodes 49a and 49b are cross-coupled to the highly concentrated n-type impurity regions 48b and 48e through the holes 53a and 53b, respectively. Further, the drain regions 56a and 56d, channel regions 56b and 56e and the source regions 56c and 56f of the polysilicon PMOS transistors are each formed by a fifth level polysilicon film, wherein the drain regions 56a and 56d are cross-coupled to the counterpart gate electrodes 54b and 54a formed of the fourth level polysilicon through the holes 55a and 55b, respectively. The source regions 56c and 56f of the polysilicon PMOS transistors constitute the power supply lines independent of each other. In the case where the level number of the polysilicon films is large, offset portions in the memory cell will be increased. Accordingly, it is preferred to use a tungsten plug for the interconnections between the aluminum electrodes 58a and 58b and the highly concentrated n-type impurity regions 48a and 48b. The gate electrode of the transfer MOS transistor should preferably be formed of a low resistive material mentioned hereinbefore in conjunction with the first embodiment. Although it has been described that the gate electrode of the driver MOS transistor is formed of the first level polysilicon film with the gate electrode of the transfer MOS transistor being formed of the second level polysilicon film, it is also possible to form the gate electrode of the transfer MOS transistor from the first level polysilicon film while forming the gate electrode of the driver MOS transistor from the second polysilicon film.

According to the instant embodiment, the area of the memory cell can be reduced because the transfer MOS transistor and the driver MOS transistor can be disposed more closed to each other.

Embodiment 8

Figure 19A:
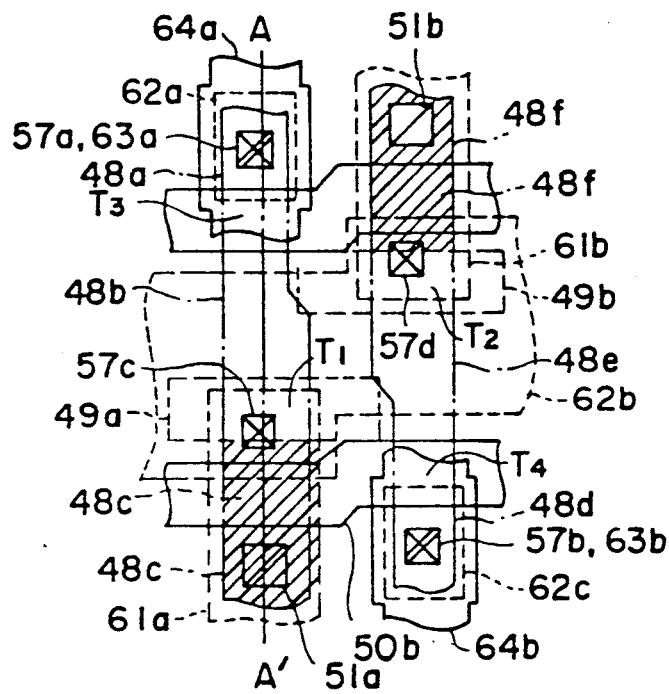
Figure 19B:
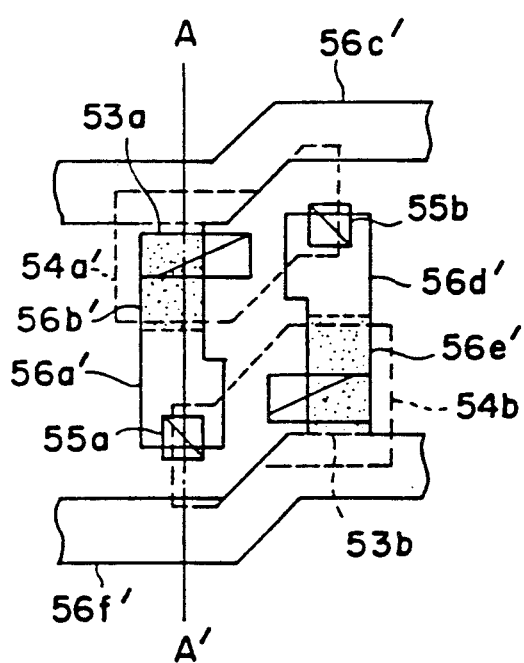

The instant embodiment is concerned with a method of reducing the resistance of the grounded wiring in the static random access memory cell according to the embodiment 7. FIGS. 19A and 19B are plan views showing a structure of the static random access memory cell according to the instant embodiment 8. Referring to FIGS. 19A and 19B, an aluminum electrode 62b of the first level destined to serve as the ground potential line is connected to the highly concentrated n-type impurity regions 48c and 48f constituting the source regions of the driver MOS transistors $T_1$ and $T_2$ through the holes 51a and 51b, respectively, and at the same time connected to n-type polysilicon films 61a and 61b through holes 57c and 57d, respectively. On the other hand, the data lines are formed of aluminum electrodes 64a and 64b of the second level through the holes 57a, 57b, 63a and 63b and the first level aluminum electrodes 62a and 62b. The gate electrodes 54a' and 54b' of the polysilicon PMOS transistors are formed in the third level polysilicon film while the source regions 56c' and 56f', channel regions 56b' and 56e' and the drain regions 56a' and 56d' of the polysilicon PMOS transistors are formed in the fourth level polysilicon film.

According to the instant embodiment, the resistance of the ground potential line can be decreased, whereby the static random access memory device can be protected against erroneous operation.

Embodiment 9

Figure 20:
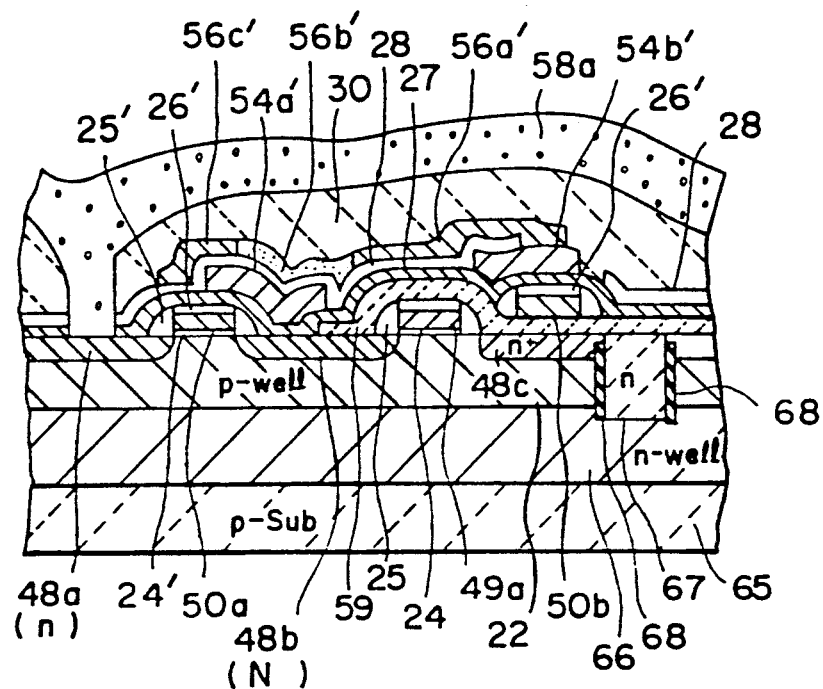

The instant embodiment is directed to a structure of the grounded wiring in the static random access memory cell according to the embodiment 7. FIG. 20 is a sectional view of the static random access memory cell according to the embodiment 9. Referring to FIG. 20, there formed in the p-type silicon substrate 65 an n-type well 66 in which a p-type well 22 is formed, being electrically isolated from the p-type silicon substrate 65. The n-type well 66 is supplied with the ground potential, wherein the highly concentrated n-type impurity region 48c constituting the source of the driver MOS transistor is connected to the n-type well 66 by way of n-type polysilicon 67 buried in a groove having side walls insulated by an insulating film 68.

Figure 21:
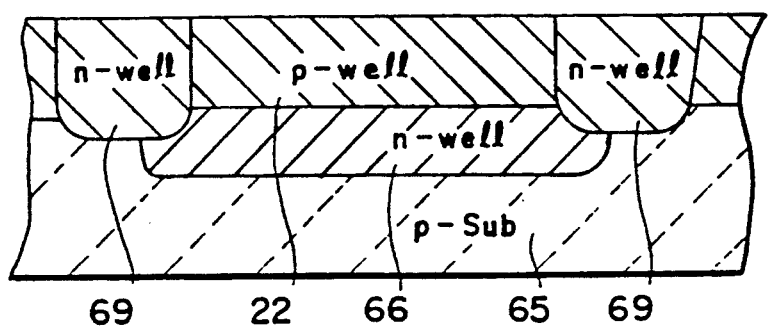

According to the instant embodiment, offset portions of the memory cell is reduced, whereby the manufacturing yield by photolithography is enhanced. The n-type well 69 of the twin wells used for the peripheral circuit as shown in FIG. 21 should preferably be used at the distal end of the n-type well in the memory cell. It should be added that the structure or the ground potential line according to the instant embodiment may also be applied to the other embodiments.

Embodiment 10

Figure 22:
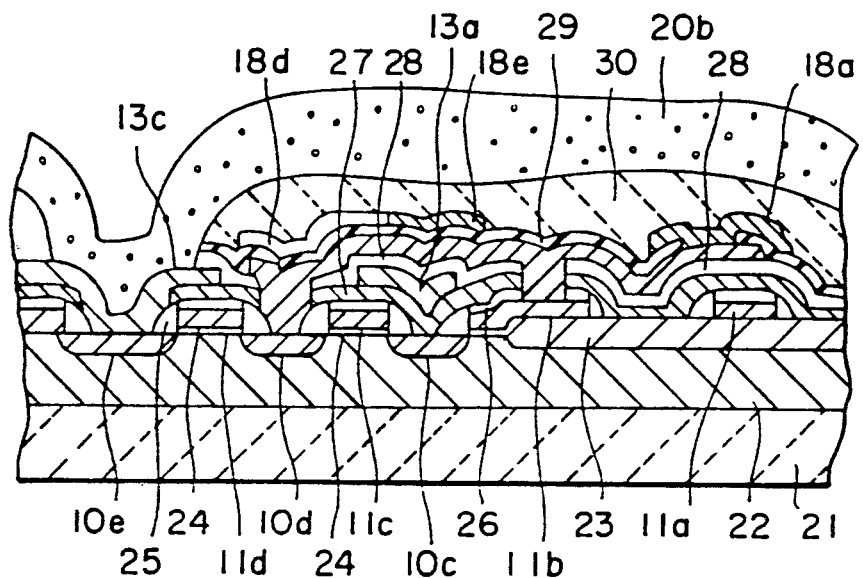

This embodiment is concerned with a structure for connection of the data line in the static random access memory cell according to the embodiment 1. FIG. 22 is a sectional view showing a structure of the static random access memory cell according to the instant embodiment 10. Referring to the figure, there is connected to the highly concentrated n-type impurity region 10e of the transfer MOS transistor the polysilicon film 13c of the second level, wherein an aluminum electrode destined to constitute the data line is connected to the abovementioned polysilicon film of the second level.

According to the instant embodiment, the depth of the hole for the connection of the aluminum electrode to serve as the data line can be relatively shallow, with the hole being disposed above the gate electrode 11d. Thus, the integration or package density of the memory cell can be significantly increased.

The aluminum line wiring method described above may also be applied to the other embodiments.

Embodiment 11

This embodiment is concerned with a method of reducing parasitic capacity of the data line in the static random access memory cell according to the embodiment 1.

Figure 23:
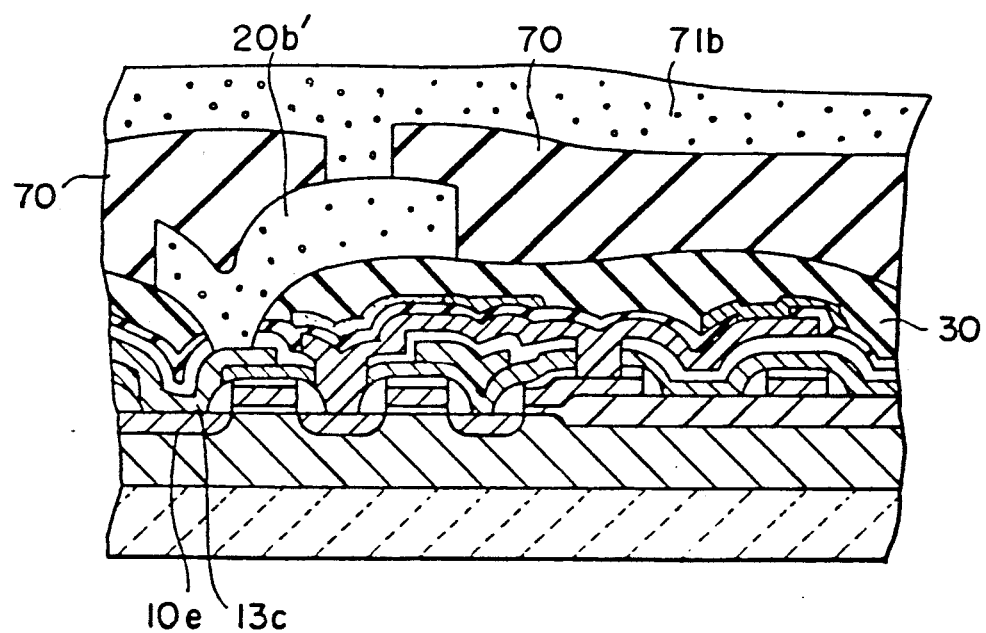

FIG. 23 is a view showing in section a structure of the static random access memory cell according to the instant embodiment 11. Referring to the figure, there is connected an aluminum electrode 20b' of the first level to the second level polysilicon film 13c which in turn is connected to the highly concentrated n-type impurity region 10e, wherein aluminum electrode 71b of the second level to serve as the data line is additionally connected to the second level polysilicon film 13c.

According to the teaching of the invention incarnated in the instant embodiment, since the interlayer silicon oxide film 70 located underneath the second level aluminum electrode to constitute the data line can be made thick, the parasitic capacity can be reduced, making it possible to operate the memory device at a higher speed.

The method of wiring the aluminum electrode described above may also be applied to the other embodiments of the invention.

Embodiment 12

Figure 24:
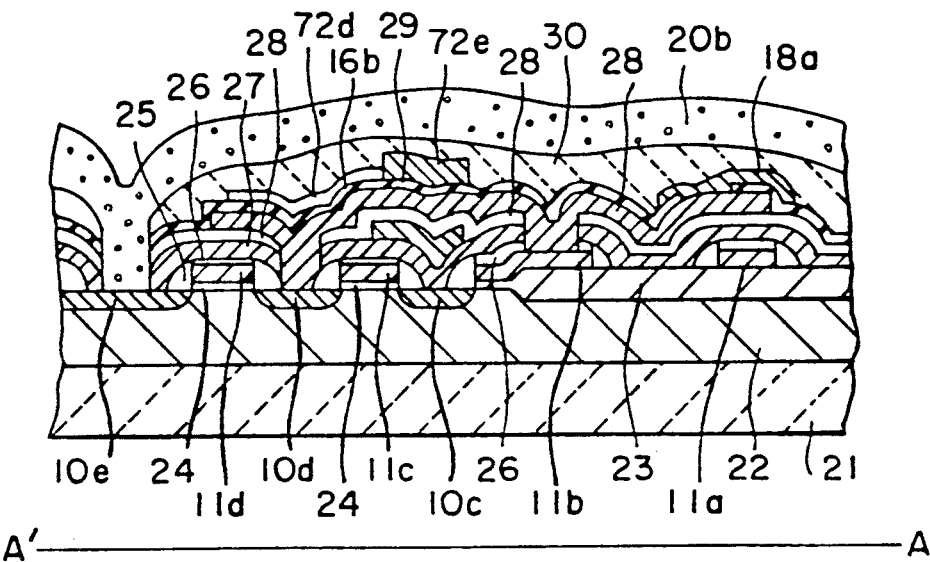
Figure 25:
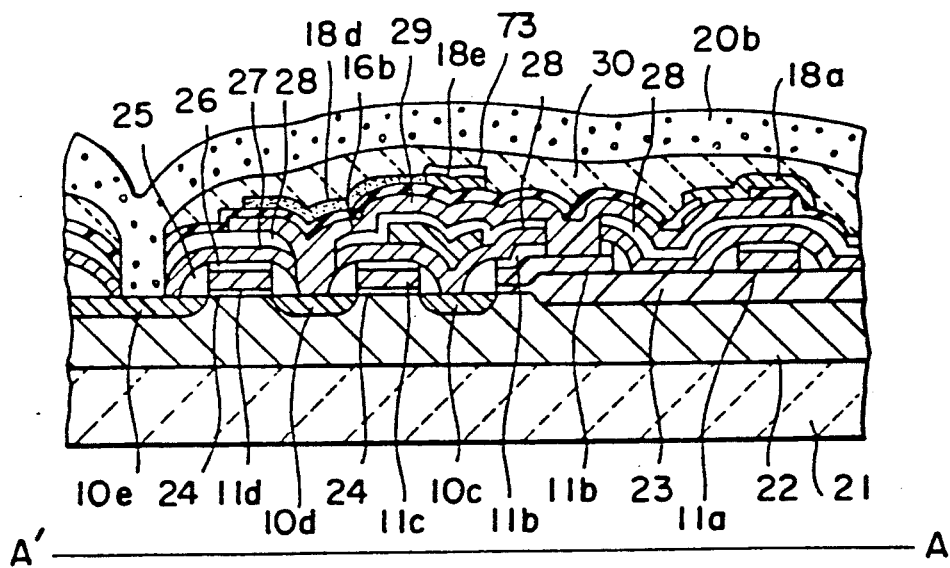

This embodiment is concerned with a method of enhancing the drivability ratio of the polysilicon PMOS transistor in the static random access memory cell according to the embodiment 1. FIG. 24 is a view showing in section a structure of the static random access memory cell according to the instant embodiment. Referring to the figure, the film thickness of the polysilicon film in the channel region 72d of the polysilicon PMOS transistor is in a range of 1 to 30 nm. In the case of this embodiment, the source region 72d constitutes the common voltage supply line. Accordingly, with a view to preventing the potential or voltage supplied to the individual cells from being lowered due to increasing in resistance, the film thickness of the polysilicon film in the source regions should preferably be thicker than at least that of the channel region 72d. The source region 72e may also be formed of two layers of polysilicon films. Further, the polysilicon film 72e in the source region may be formed with a silicide layer 25 with a refractory metal such as tungsten.

According to the instant embodiment, since the current drivability ratio can be increased due to the thin-film effect of the channel portion of the polysilicon PMOS transistor incorporated in a complementary MOS inverter employed in the flip-flop circuit of the static random access memory cell, stable operation of the memory cell can be ensured to thereby prevent the erroneous operation of the static random access memory device. The structure of the polysilicon PMOS transistor described above may also be applied to all of those in the memory cells or devices according to the other embodiments.

Embodiment 13

Figure 26:
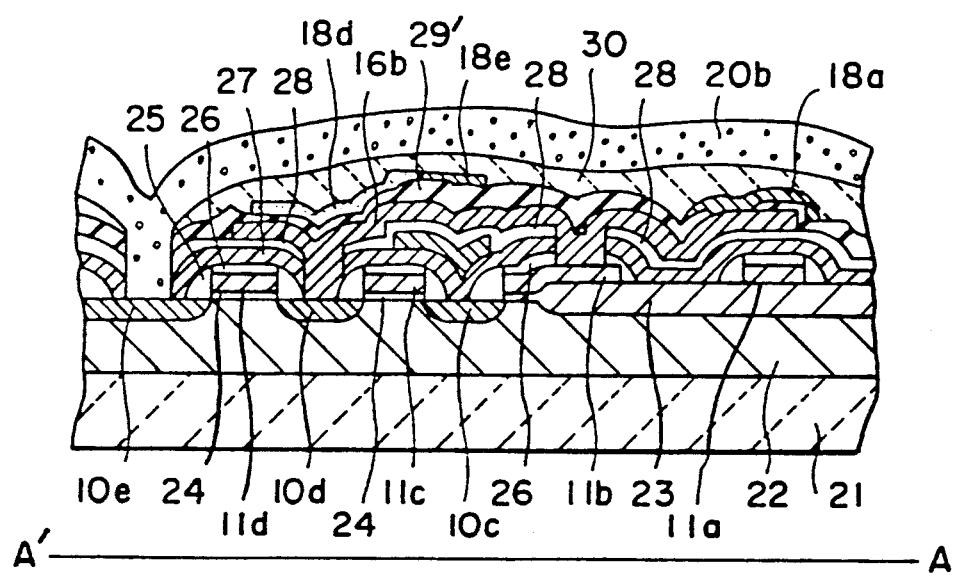

This embodiment is directed to another method of increasing the current drivability ratio of the polysilicon PMOS transistor according to the preceding embodiment 12. FIG. 26 is a view showing in section a structure of the static random access memory cell according to the instant embodiment. Referring to the figure, it can be seen that the gate insulation film 29 of the polysilicon PMOS transistor is thinner than the other portions, wherein the thin film portion of the insulation film 29 has a thickness in a range of 5 to 10 nm.

According to the instant embodiment, the current drivability ratio can be increased due to the thin-film effect of the gate insulation film of the polysilicon PMOS transistor while decreasing the current leakage which would otherwise take place at the drain end in the polysilicon transistor. By virtue of this feature, there can be provided a static random access memory which has extremely low in the power dissipation and which is unlikely to operate erroneously. The structure of the polysilicon PMOS transistor according to the instant embodiment can equally be applied to all the polysilicon PMOS transistors in the other embodiments of the invention.

Embodiment 14

Figures 27A, 27B:
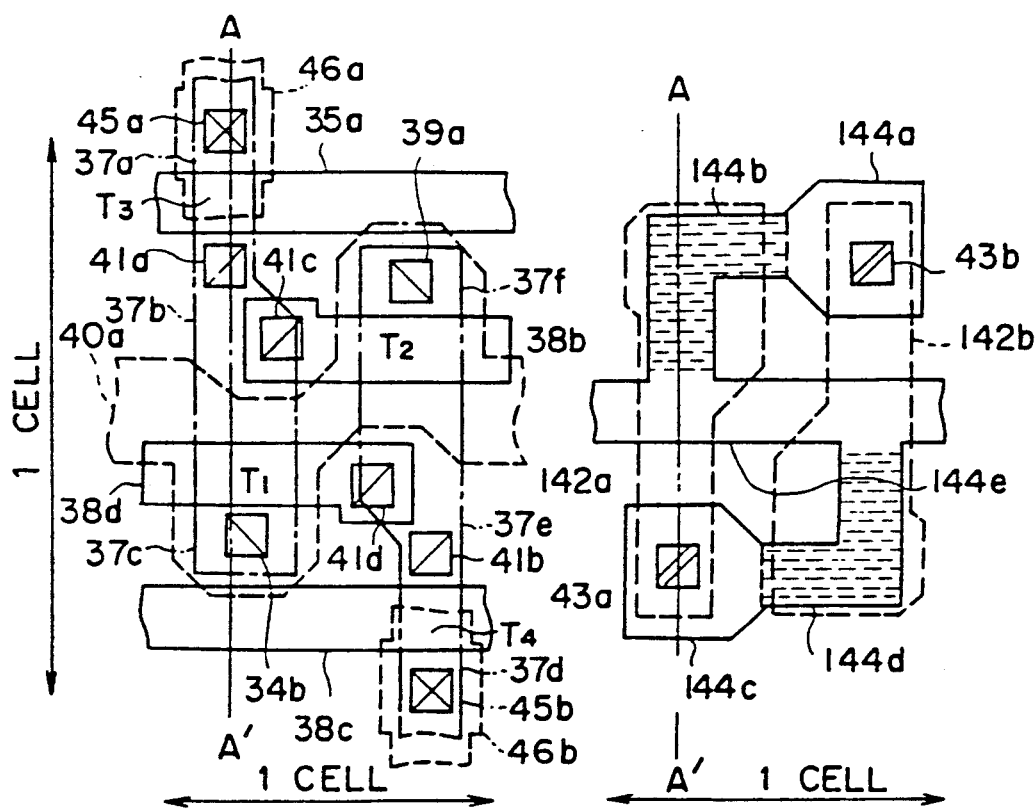

This embodiment is directed to a static random access memory cell having a structure differing from the that of the embodiment 1 in that a load element is constituted by highly resistive polysilicon. FIG. 27 shows in a plan view the structure of the static random access memory cell according to the instant embodiment 14. The equivalent circuit of this memory cell is identical with that shown in FIG. 3. Referring to FIG. 27, a power supply wiring to the memory cell is constituted by a fourth level polysilicon film 144e doped with arsenic to which high resistive polysilicon films 144b and 144d of the fourth level are connected and which is also connected to the third level polysilicon films 142b and 142d constituting the storage nodes by way of fourth low resistive polysilicon films 144a and 144c and holes 43b and 43a, respectively, whereby a very small current is supplied to the storage nodes of the individual memory cells from the power supply source. The film thickness of the polysilicon films of the third and fourth levels should preferably be at least 100 nm in order to reduce the field effect for the highly resistive polysilicon. According to the instant embodiment, there can be provided a static random access memory having a high packing density.

Embodiment 15

Figure 28A:
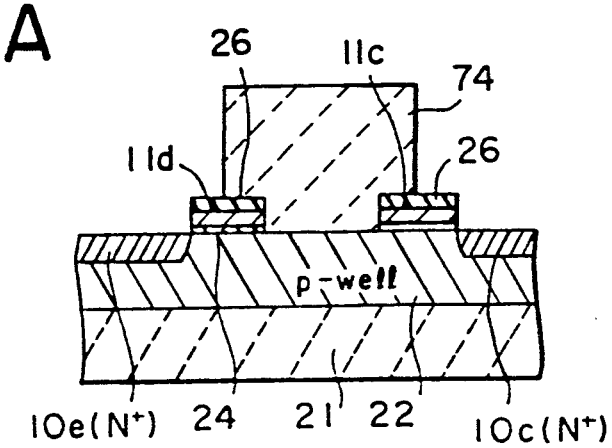
Figure 28B:
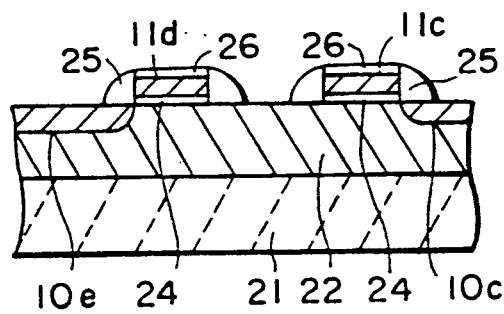
Figure 28C:
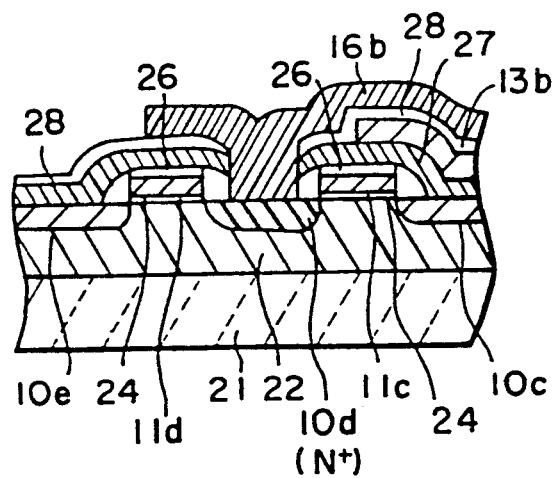

This embodiment of the invention is concerned with a method of forming the pn-junction of the storage node in the static random access memory cell according to the embodiment 1. FIG. 28A to 28C are sectional views for illustrating a process for forming the storage nodes in the memory cell according to the fifteenth embodiment. The manufacturing steps up to that for forming the gate electrodes 11c and 11d of the MOS transistor are same as those described hereinbefore in conjunction with the first embodiment. After finishing the gate electrodes 11c and 11d, a photoresist layer 74 is formed at a portion where the storage node is to be realized and subsequently n-type impurity ions such as arsenic or the like are implanted in a dose of about $10^{15}$ cm$^{-2}$ as in the case of the steps for forming the highly concentrated n-type impurity regions in other portions than the storage node portion. Subsequently, after removing the photoresist 74, anneal is carried out at 900° C. in the nitrogen atmosphere to thereby form highly concentrated n-type impurity regions 10a to 10e having a depth in a range of 0.1 to 0.2 μm (FIG. 28A). Next, after depositing a silicon oxide film in a thickness of 200 to 400 nm by the LPCVD method, spacer films 25 are formed on the side walls of the gate electrodes 11c and 11d by anisotropic dry etching (FIG. 28B). The succeeding manufacturing steps up to that of dry-etching the polysilicon film 16b of the third level are same as those described hereinbefore in conjunction with the first embodiment by reference to FIGS. 6C to 6E. After depositing or processing the third level polysilicon film 16b, anneal is carried out so that the n-type impurity is driven in the p-type well 22 from the third level polysilicon film 16b to thereby form a highly concentrated n-type impurity region 10' (FIG. 28C). The succeeding steps are same as those illustrated in FIGS. 6F and 6G in conjunction with the first embodiment.

According to the instant embodiment, the highly concentrated n-type impurity region 10d' for the storage node is formed through impurity diffusion from the region decreased in the area by the spacer insulator films 25. Thus, it is possible to reduce the area of the pn-junction for the storage node to thereby enhance the soft-error immunity of the static random access memory. The method of forming the storage node portion described above can equally be applied to the memory cells according to the other embodiments of the invention.

Embodiment 16

Figure 29:
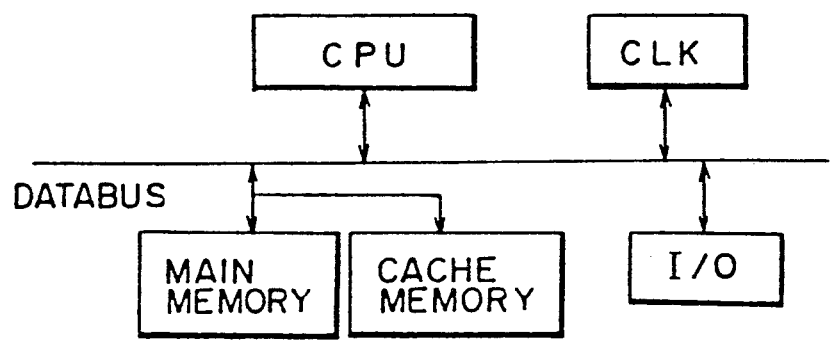
FIG. 29 is a block diagram showing a further exemplary embodiment of the invention.

This embodiment is concerned with a cache memory of a high-performance work station in which the static random access memory device according to the invention is employed. FIG. 29 is a block diagram showing a system arrangement of the high-performance work station according to the instant embodiment 16. Referring to the figure, a main memory of the high-performance work station is constituted by a dynamic random access memory (DRAM) of a large capacity, while the cache memory is constituted by a high-speed static random access memory (SRAM) according to the invention.

According to the instant embodiment, data in the cache memory can be accessed at an extremely high speed instead of accessing directly the large capacity main memory, whereby an extremely high speed operation can be accomplished. Although the memory according to the invention is applied to the cache memory in the case of the instant embodiment, it goes without saying that the memory can equally be applied to the main memory. Further, the application of the invention is not limited to the high performance work station but can be applied to cache memories of large scale computers and the main memories of the general-purpose computers and additionally to memories of portable machines such as personal computers, memory cards and the like capable of operating from battery cells mounted thereon by virtue of the super low power dissipation feature of the static random access memory according to the invention.

Embodiment 17

Figure 30:
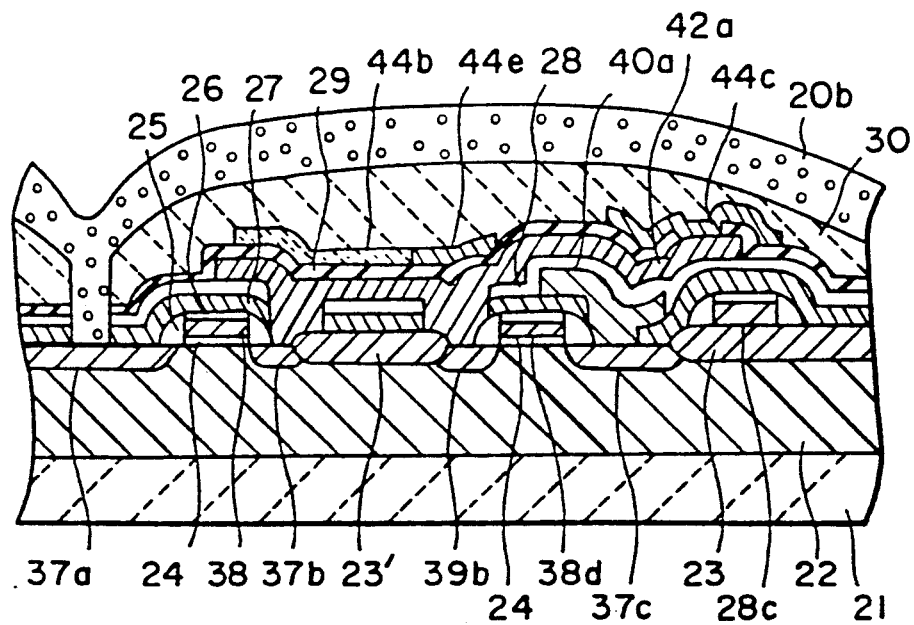

This embodiment is concerned with a method of reducing the area of the pn-junction for the storage nodes in the flip-flop circuit of the static random access memory cell according to the sixth embodiment. FIG. 30 is a view showing in section a structure of the static random access memory cell according to the instant embodiment. Referring to the figure, a highly concentrated n-type impurity region 37b for realizing the pn-junction in the storage node is separated by a thick field oxide film 23' for thereby reducing the area of the pn-junction. The highly concentrated n-type impurity region 37b separated by the abovementioned field oxide film 23' is connected by the gate electrode 43a of the polysilicon PMOS transistor.

According to the instant embodiment, the manufacturing process can be simplified and the manufacturing cost can correspondingly be reduced.

As will be appreciated from the foregoing description, there can be provided according to the invention the semiconductor memory device having the memory cells of extremely small area and capable of operating at a very high speed without erroneous operation due to irradiation with α-rays and lowering of the power supply voltage by virtue of the structure in which the areas of the pn-junctions for the storage nodes in the flip-flop circuit are automatically decreased to a possible minimum amount in a self-aligning manner, the storage node is additionally provided with the capacitance elements of stacked structure, the flip-flop circuit can be implemented in the complementary inverter of the stacked structure and in which the cross-coupling in the flip-flop circuit can automatically be realized in a self-aligning manner.

Embodiment 18

Figure 31:
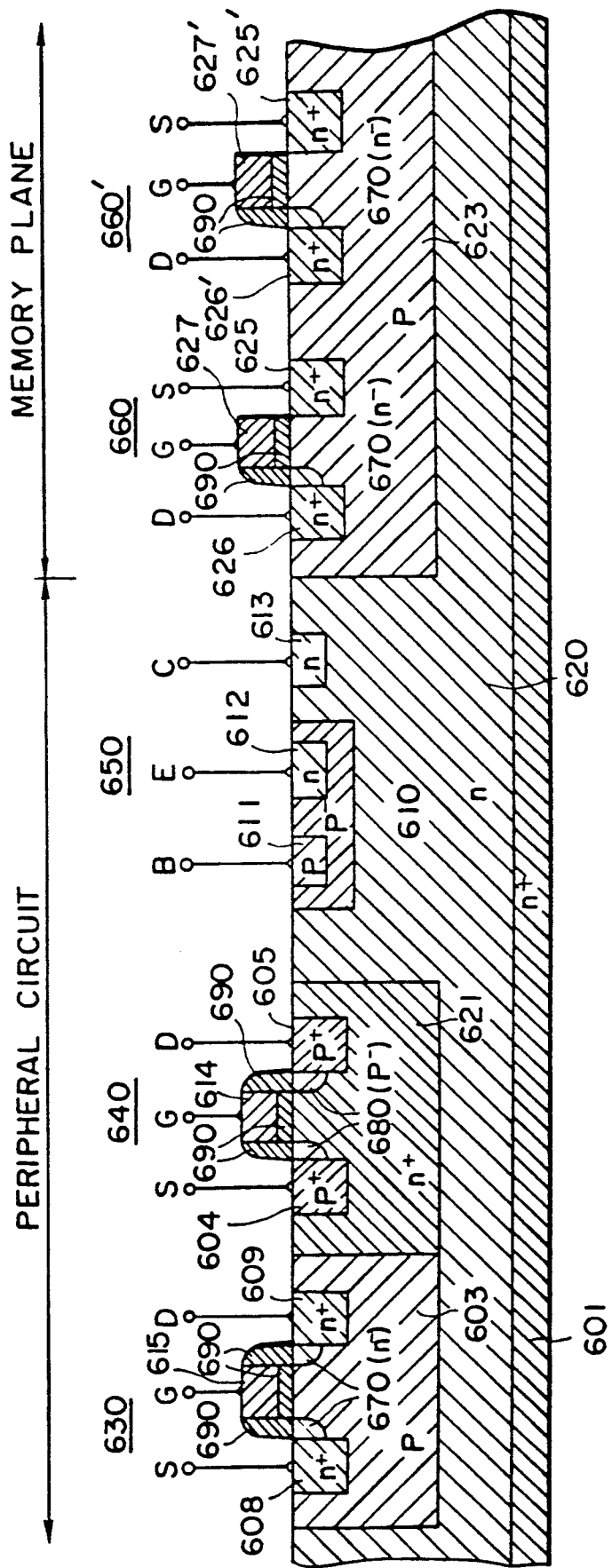
FIG. 31 is a sectional view showing another exemplary embodiment of the invention.

FIG. 31 shows a cross section of 18th exemplary embodiment of the arrangement of constituent elements of the semiconductor memory device according to the present invention. Transistors 660 and 660' which constitute the memory cell shown in FIG. 31 are disposed asymmetrically to each other. By forming the highly concentrated impurity region in a low concentrated impurity region or by providing the low concentrated impurity region only for one of the transistor, it is possible to make smaller the resistance of the low concentrated impurity region for thereby lowering the resistance of interconnection between the ground potential line and the driver MOS FET in the flip-flop circuit of the static random access memory cell as well as the parasitic resistance of interconnection between the storage node and the driver MOS FET, whereby operation of the memory cell can be stabilized against noise and fluctuations in the supply voltage. Further, because the parasitic serial resistance of source of the driver MOS FET is low, the problem of the LDD structure that the transfer conductance is decreased because of the parasitic serial resistance can be solved, whereby the transfer conductance of the driver MOS FET can be increased. The channel width of the driver MOS FET can be decreased while maintaining constant the ratio in the transfer conductance between the driver MOS FET and the transfer MOS FET, which in turn allows the area of the memory cell to be diminished.

A p-type well region 603 is formed in a semiconductor substrate which is defined by an n+-type impurity layer 601 and an n-type semiconductor layer 602. A source S and drain D which are respectively defined by n+-type impurity regions 608 and 609, together with a gate G which is defined by a region 615, are provided in the p-type well region 603 to form an N-type MOST 630. On the other hand, an n+-type well region 621 is formed in the n-type semiconductor layer 602, and a source S and a drain D which are respectively defined by p+-type impurity regions 604 and 605, together with a gate G which is defined by a region 614, are provided in the n+-type well region 621 to form a P-type MOST 640. The reference numeral 610 denotes a p+-type well region which is shallower than the p-type well region and which has a higher impurity concentration than that of the latter. Thus, a high-performance common-collector type npn bipolar transistors 650 is formed having a base B defined by the p+-type well region 610, an emitter E defined by an n-type impurity region 612, a base electrode terminal B defined by a p-type impurity region 611 and a collector C defined by an n-type impurity region 613. This bipolar transistor 650 can be formed simply by adding a mask for forming the base region 610 to a conventional PMOS manufacturing process. A p-type well region 623 is formed within the semiconductor substrate. Sources 625, 625' and drains 626, 626' which are defined by an n+-type impurity layer are formed in the region 623, and gates 627 and 627' are further provided to form N-type MOSTs 660 and 660'.

The npn bipolar transistor 650, the P-type MOS 640, the N-type MOST 630, etc. are used as constituent elements of the sense amplifier or those of a peripheral circuit of the semiconductor memory device according to the invention. The N-type MOSTs formed in the p-type well region 623 are employed to form memory cells. This region is therefore used as a memory plane.

In the embodiment shown in FIG. 31, the MOSTs are formed so as to have a lightly-doped drain structure. More specifically, the size of the MOSTs is reduced in order to achieve larger scale integration, and n−-type regions 670 and p−-type- regions 680 for relaxing electric field are provided for improving the dielectric strength. Since a memory plane can be operated with a lower voltage than that for a peripheral circuit, when the MOSTs are employed as constituent elements of a memory plane, these field relaxing regions can be narrowed. Further, the relaxing regions may be omitted from the area between a source S and a gate G which can be isolated from each other relatively easily. Such arrangement is exemplarily illustrated by the N-type MOSTs 660 and 660' shown in FIG. 31.

Embodiment 19

Figure 32A:
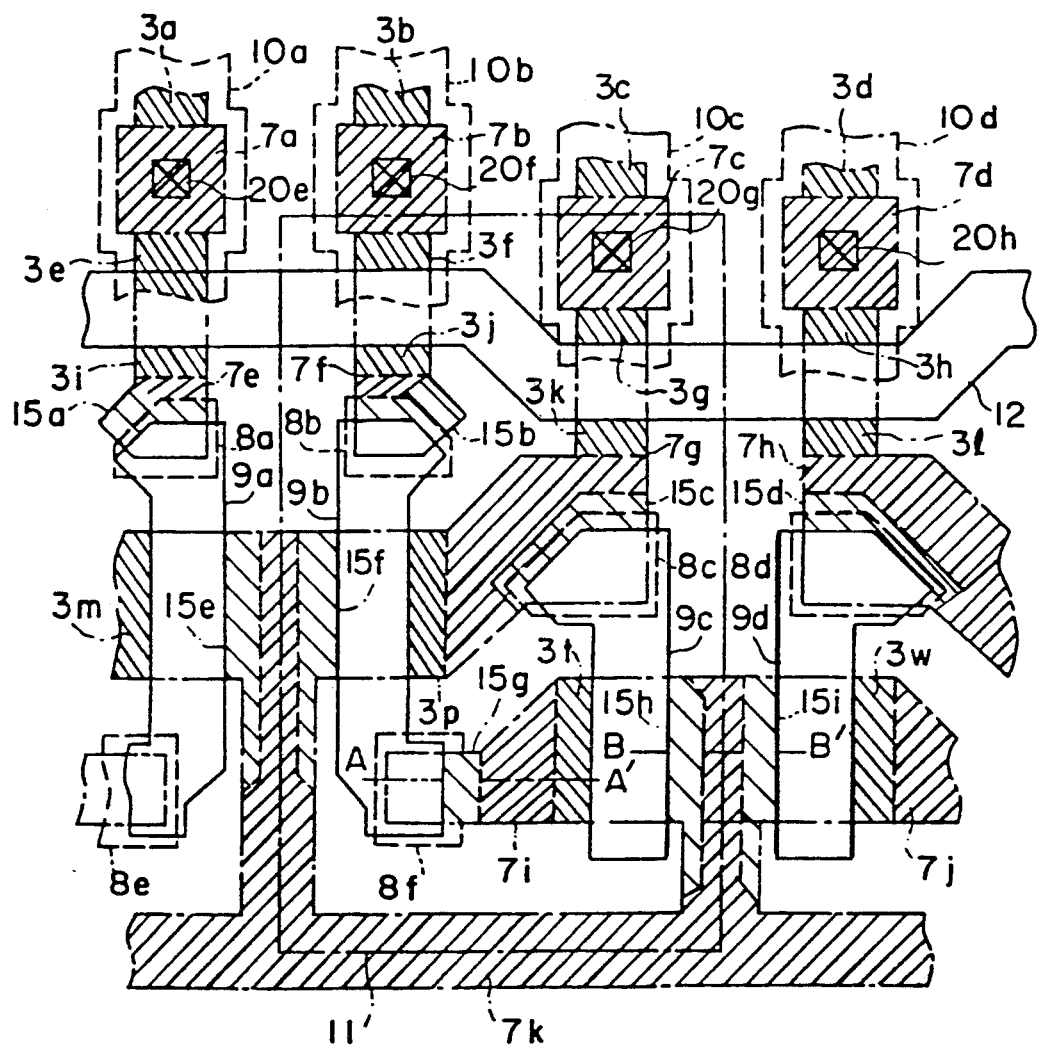
FIG. 32A is a plan view of a semiconductor memory device according to still another embodiment of the invention.
Figure 32B:
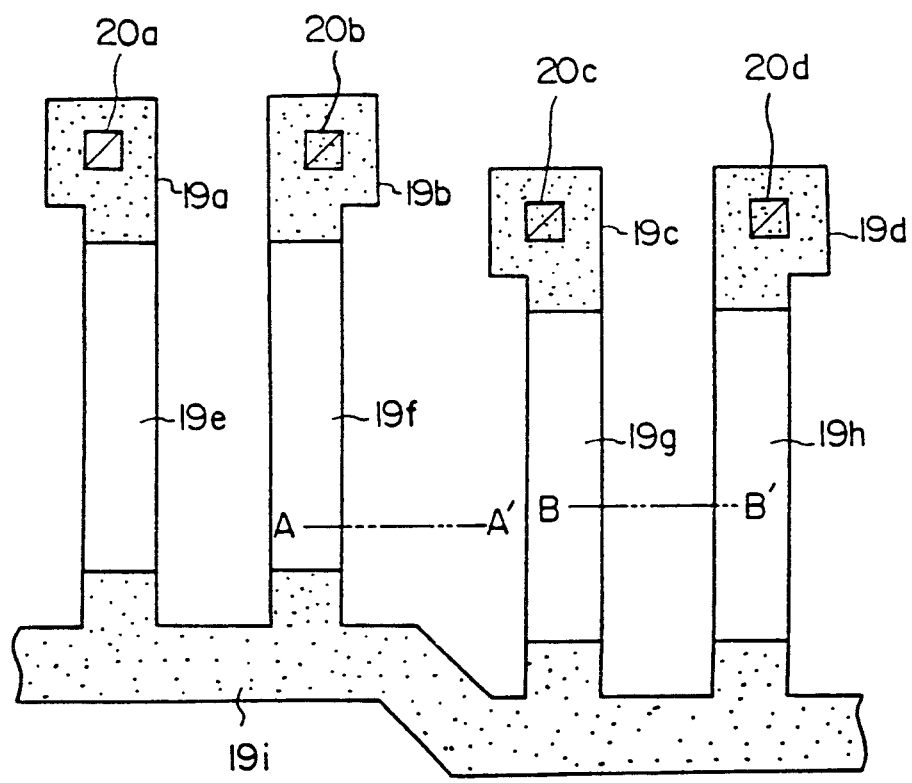
FIG. 32B is a fragmentary plan view of the same.
Figure 33A:
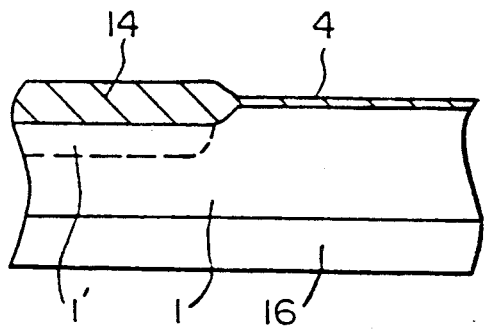
Figure 33B:
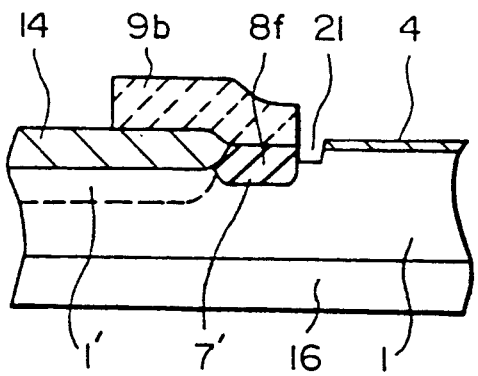
Figure 33C:
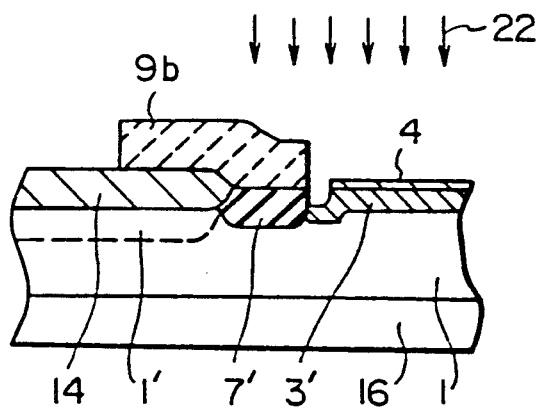
Figure 33D:
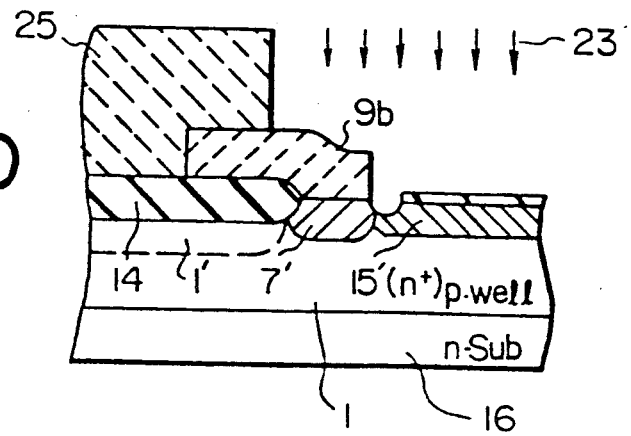
Figure 33E:
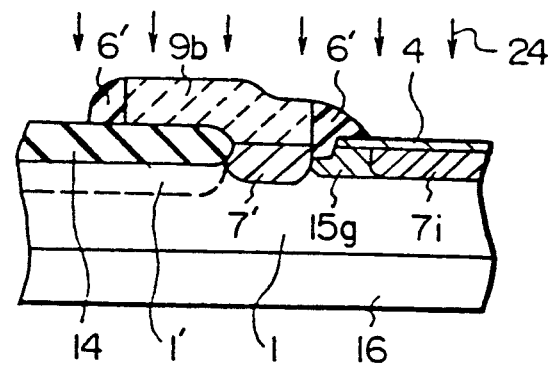
Figure 33F:
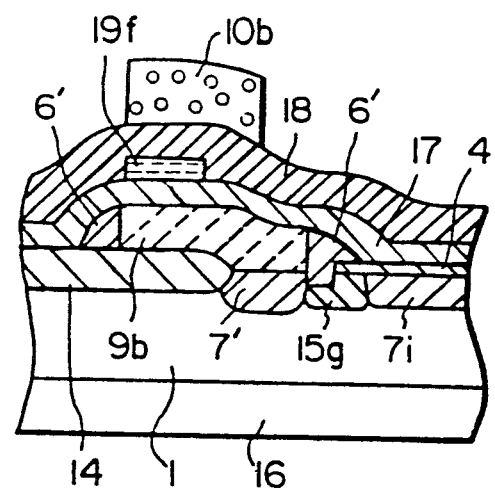

FIGS. 32A to 32D are views for illustrating a structure of the static random access memory device according to a nineteenth embodiment of the invention, wherein FIG. 32A is a plan view showing a layout of transfer and driver n-channel MOS FETs constituting a memory cell and wiring layers, FIG. 32B is a plan view showing a highly resistive polysilicon portion, FIG. 32C is a sectional view taken along the line A—A' in FIG. 32A, and FIG. 32D is a sectional view taken along the line B—B' in FIG. 32B.

In the embodiments of the invention described below, i.e. in FIGS. 32 to 38, reference numeral 1 denotes a p-type well, reference numeral 1 denotes a p-type well, 1' denotes a channel stopper layer, 3, 3', 3a, 3b, 3c, 3d, 3e, 3f, 3g, 3h, 3i, 3j, 3k, 3l, 3m, 3n, 3o, 3p, 3q, 3r, 3s, 3t, 3u, 3v, 3w, 3x and 27b' denote low concentrated n-type impurity regions, 4 denotes a gate insulation film, 6, 17 and 18 denote SiO₂-films 6' denotes a side spacer, 7, 7', 7a, 7b, 7c, 7d, 7e, 7f, 7g, 7h, 7i, 7j, 7k, 15', 15a, 15b, 15c, 15d, 15e, 15f, 15g, 15h, 15i, 26, 27a', 27b and 27a denote highly concentrated n-type impurity regions, 8a, 8b, 8c, 8d, 8e, 8f, 20a, 20b, 20c, 20d, 20e, 20f, 20g, 20h, 20i, 20j, 20k, 20l, 30a, 30b, 30c 30d and 30e denote holes for interconnection, 9, 9a, 9b, 9c, 9d and 28 denote gate electrodes, 10a, 10b, 10c, 10d, 13 and 13' denote data lines, 11 denotes a one-bit memory cell region, 12 denotes a word line, 14 denotes a field oxide film, 16 denotes a silicon substrate, 19a, 19b, 19c, 19d and 19i denote low resistive polysilicon films, 19e, 19f, 19g and 19h denote highly resistive polysilicon films, 21 denotes a silicon groove, 22 denotes phosphorus ions, 23 and 24 denote n-type impurity ions, 25 denotes a photoresist, 29 denotes an n-type impurity ion doped region, 31a, 31b and 31c denote aluminum electrodes, 33a and 33b denote second level silicon films, 35a and 35f denote source regions, 35b and 35e denote channel regions, 35c and 35d denote drain regions, T₁ and T₂ denote driver n-channel MOS FETs, T₃ and T₄ denote transfer n-channel MOS FETs, T₅ and T₆ denote polysilicon PMOS FETs, and N₁ and N₂ denote storage nodes, respectively.

Referring to FIG. 32A, there are formed in the one-bit memory cell region 11, a flip-flop circuit constituted by a pair of driver n-channel MOS FETs and a pair of transfer n-channel MOS FETs connected to the drain regions of the former, wherein the gate electrode 9b of one of the driver MOS FETs constituting the above-mentioned flip-flop circuit is cross-coupled to a highly concentrated n-type impurity region 7i constituting the drain region of the other driver MOS FET through the hole 8f. Similarly, the gate electrode 9c of the other driver MOS FET is cross-coupled to a high concentrated n-type impurity region 7g constituting the drain region of the said one driver MOS FET through the hole 15c. Further connected to the pair of transfer MOS FETs are the gate electrode of the one driver MOS FET and the highly concentrated n-type impurity region 7g constituting the drain region of the other driver MOS FET, wherein these transfer MOS FETs have a common gate electrode 9e. As can be seen in FIG. 32B, connected to the storage nodes constituted by the cross coupling in the abovementioned flip-flop circuit through the holes 20b and 20c are highly resistive polysilicon films 19f and 19g which are formed in the insulation films overlying the abovementioned driver MOS FETs, respectively. Low resistive n-type impurity regions are formed at both ends of the abovementioned highly resistive polysilicon films, respectively, whereon one low resistive polysilicon films 19b and 19c are connected to the storage nodes through the holes 20b and 20c, respectively, while the other low resistive polysilicon film 19i constitutes a common power supply wiring.

FIG. 32C shows a sectional structure of the abovementioned cross-coupling interconnection between the gate electrode 9b of the one driver MOS FET and the highly concentrated n-type impurity region 7i constituting the drain region of the other driver MOS FET, wherein the interconnection mentioned above is realized through the highly concentrated n-type impurity region 7' formed by impurity diffusion from the gate electrode 9b and the highly concentrated n-type impurity region 15g formed underneath the side spacer 6' for the LDD. FIG. 32D is a view showing in section a structure of the driver MOS FET disposed adjacent to the driver MOS FET within the one-bit memory cell region 11 shown in FIG. 32A. As can be seen, highly concentrated n-type impurity regions 15h and 15i are formed beneath the side spacers 6' formed on the source-facing side walls of the gate electrodes 9c and 9d.

A pair of data lines 10b and 10c in the static random access memory cell are connected to the highly concentrated n-type impurity regions 7b and 7c constituting the drains (or sources) of the transfer MOS FETs through the holes 20f and 20g, respectively.

Figure 34D:
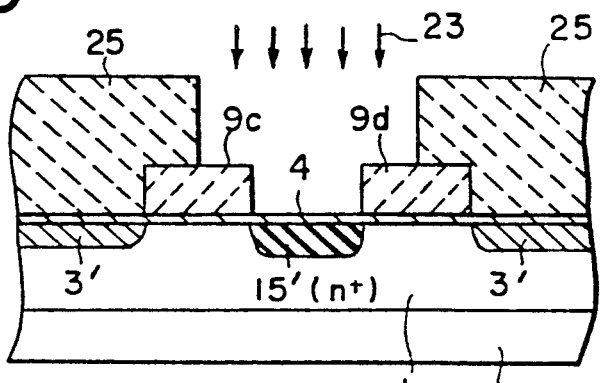
Figure 34E:
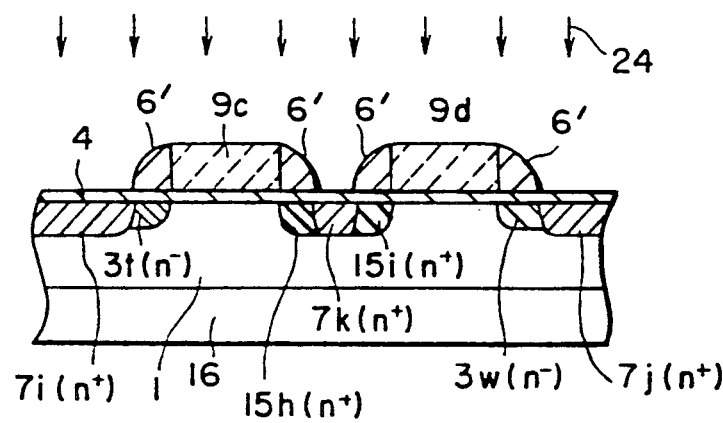
Figure 34F:
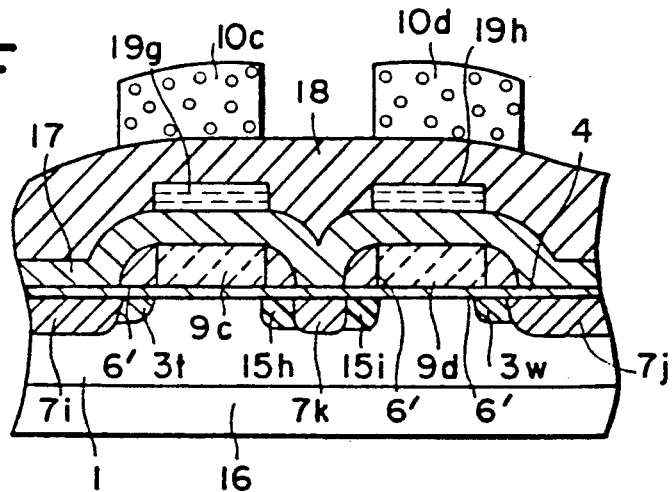

Referring to FIGS. 33 and 34, description will now be made of a process for manufacturing the memory cell according to the instant embodiment. FIGS. 33A and 33F and FIG. 34A to 34F are sectional views of the static random access memory cell at different manufacturing steps, wherein FIGS. 33A to 33F are sectional views taken along the line A—A' in FIG. 32A, and FIGS. 34A to 34F are sectional views taken along the line B—B' in FIG. 32A. In the case of the instant embodiment of the invention, all the MOS FETs employed in the memory cell and formed in the silicon substrate are n-channel MOS FETs realized within a p-type well. Although a complementary MOS (CMOS) circuit formed in twin wells are used as the peripheral circuit of the memory cell, it may be a single-well structure realized in a p-type well or a n-type well. The conduction type of the silicon substrate may be either n-type or p-type. The description which follows is directed to only the memory cell manufacturing process, being understood that the peripheral PMOS circuit can be manufactured by using known technique.

At first, the p-type well 1 having an impurity concentration of $10^{16}$ cm$^{-3}$ to $10^{18}$ cm$^{-3}$ and a depth of 1 to 5 μm is formed in the n-type silicon substrate 16 having the resistivity of about 10 Ω·cm by boron ion implantation method and thermal drive-in method. Subsequently, a p-type channel stopper layer 1' and a silicon oxide film (field oxide film) 14 of 100 to 1000 nm in thickness for element isolation are formed by a local silicon oxidation or LOCOS method, which is then followed by formation of the gate insulation film 4 having a thickness of 10 to 30 nm in a region constituting the active region of the MOS FET (see FIG. 33A and FIG. 34A). Next, the hole 8f for interconnection is opened in a portion of the gate insulation film 4 by wet etching using a fluoric acid solution with the aid of a photoresist mask, and polysilicon is deposited in a thickness of 300 nm by a low pressure chemical vapor deposition method (LPCVD method). Thereafter, phosphorus is introduced as the n-type impurity in a dose of $3 \times 10^{21}$ cm$^{-3}$ gas phase drive-in method, and then the gate electrodes 9b, 9c and 9d are patterned by photolithography and dry etching. The amount of phosphorus may be on the order of $10^{19}$ to $10^{21}$ cm$^{-3}$. In this case, a portion of the hole for interconnection formed previously in a portion of the gate insulation film 4 is etched upon dry etching of the gate electrode, whereby a silicon groove 21 is formed. Further, a highly concentrated n-type impurity region 7' is formed on the surface of the p-type well 1 at the interconnecting portion of that well 1 and the gate electrode 9b upon impurity doping of the polysilicon film constituting the gate electrode and through subsequent heating process (see FIG. 33B and FIG. 34B). Next phosphorus ions are implanted in a self-aligning manner by using the abovementioned gate electrodes 9b, 9c and 9d as the mask for the ion implantation, and anneal is carried out in a predetermined manner to thereby form a low concentrated n-type impurity region 3' having a concentration of $1 \times 10^{17}$ cm$^{-3}$ (see FIG. 33C and FIG. 34C).

Subsequently, by using the photoresist 25 as the mask for ion implantation phosphorus ions 23 are implanted in a self-aligning manner with a dose of $2 \times 10^{15}$ cm$^{-2}$ and at implantation energy of 40 keV and annealed for 10 minutes at 900° C. for activation to thereby form the highly concentrated n-type impurity region 15'. In this case, an end portion of the photoresist mask is positioned on the gate electrode. By selecting the thickness of the photoresist in a range of 1 μm to 2 μm so as to be thicker as compared with that of the gate electrode, the difference between the design size ad the actual size of the photoresist can be made extremely small (see FIG. 33D and FIG. 34D). The ion implantation can be carried out in a dose within a range of $5 \times 10^{14}$ to $5 \times 10^{15}$ cm$^{-2}$ with implantation energy in a range of 30 to 80 keV. Next, the photoresist 25 is removed and then a SiO$_2$-film is deposited in a thickness of 200 nm with an improved offset-compensating and covering quality by the LPCVD method, which is then followed by dry etching with directivity for etching the SiO$_2$-film to thereby form the side spacers 6' on the side walls of the gate electrodes 9b, 9c and 9d, whereon phosphorus ions are implanted as the n-type impurity ions 24 in a dose of $5 \times 10^{15}$ cm$^{-2}$ with implantation energy of 50 keV by using as the mask for implantation the gate electrodes 9b, 9c and 9d and the side spacers 6' mentioned above, and an anneal operation is then performed in a predetermined manner to thereby form the highly concentrated n-type impurity regions 7i, 7j and 7k. The thickness of the above-mentioned $SiO_2$ may be in a range of 100 to 400 nm. At this time, there are formed in the silicon substrate underlying the side spacers 6' the highly concentrated n-type impurity regions 15g, 15h and 15i and the low concentrated n-type impurity regions 3t and 3w (see FIG. 33E and FIG. 34E). Next, the $SiO_2$-film is deposited in a thickness of 100 nm by the LPCVD method, which is then followed by opening of the hole for interconnection (not shown) and subsequent deposition of the polysilicon film by the LPCVD method. After patterning into the shape of the highly resistive elements by photolithography and dry etching, arsenic ions are implanted in the portions except the highly resistive polysilicon portions 19f, 19g and 19h in a dose of $1 \times 10^{15}$ cm$^{-2}$ with implantation energy of 50 keV and annealed as required to lower the resistivity. Thereafter, the $SiO_2$-film 18 having a composite structure of a $SiO_2$-film of 50 to 100 nm in thickness and a $SiO_2$-film containing phosphorus and having a thickness of 100 to 400 nm is deposited in a thickness of 500 nm. After opening the hole for interconnection (not shown), aluminum is deposited in a thickness of 0.3 to 2 μm by a sputtering method, which is then followed by patterning of the data lines 10b, 10c and 10d by photolithography and dry etching. For preventing silicon deposition in the extremely small holes for interconnection, a material having a property of barrier such as TiN, TiW or the like may be laid beneath the aluminum electrodes.

Embodiment 20

Figure 35A:
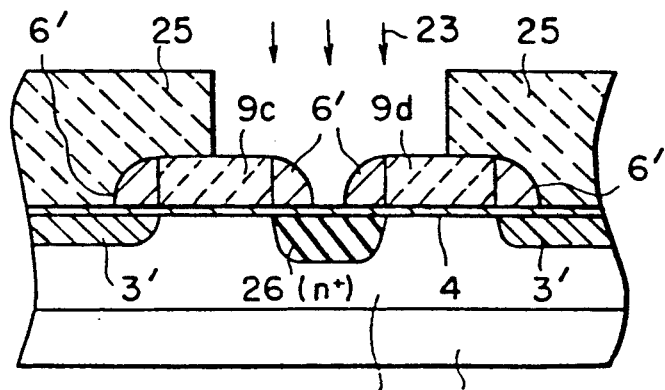
Figure 35B:
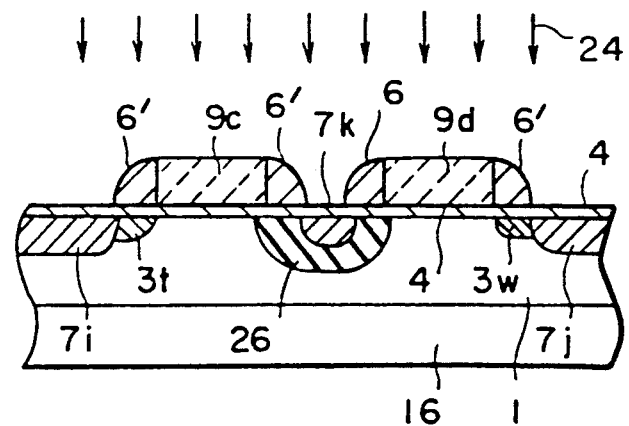
Figure 35C:
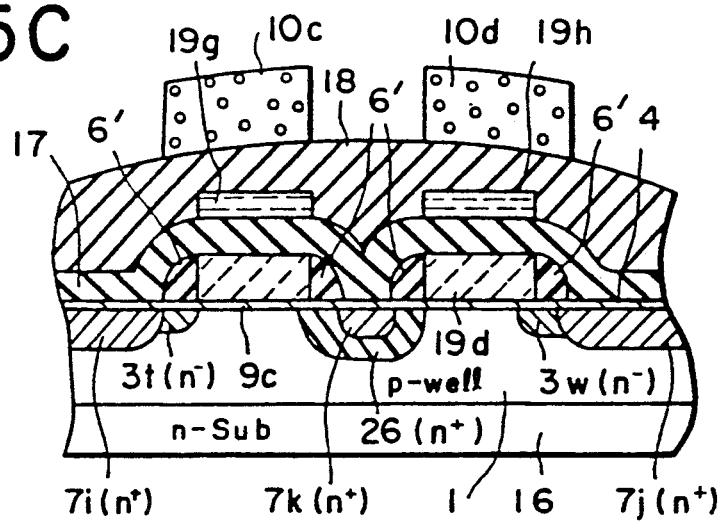

This embodiment is concerned with another method of increasing the concentration and thereby lowering the resistivity of the low concentrated impurity region which constitutes the directly interconnected portions of the sources and the gate electrodes of the driver LDD MOS FETs and the silicon substrate in the static random access memory device according to the ninth embodiment. FIGS. 35A to 35C are sectional views for illustrating the manufacturing process of the element according to the instant embodiment. After forming the gate electrodes 9c and 9d and the low concentrated n-type impurity region 3' through the utterly same manufacturing process as described in conjunction with the preceding embodiment by referring to FIGS. 34A to 34C, a $SiO_2$-film is deposited in a thickness of 200 nm by the LPCVD method to cover smoothly the offset portions, and then the $SiO_2$-film is etched by directive dry etching to form the side spacers 6' on the side walls of the gate electrodes 9c and 9d. Thereafter, by using as the mask for ion implantation the gate electrodes 9c and 9d, the side spacers 6' and the photoresist 25, arsenic ions are implanted as the n-type impurity ions 23 in a dose of $2 \times 10^{15}$ cm$^{-2}$ implantation energy of 40 keV in a self-aligning manner. After removing the photoresist, anneal is performed at a temperature of 900° C. for 20 minutes to thereby form the highly concentrated n-type impurity region 26. Parenthetically, the impurity ion for forming the highly concentrated n-type impurity region 26 mentioned above may be phosphorus. Further, the anneal may be carried out at 900° to 950° C. for 10 to 30 minutes (FIG. 35A). Next, by using the gate electrodes 9c and 9d and the side spacers 6' as the mask for ion implantation, arsenic ions are implanted in a self-alignment as the n-type impurity ions 24 in a dose of $5 \times 10^{15}$ cm$^{-2}$ at implantation energy of 50 kev and annealed as required for forming highly concentrated n-type impurity regions 7i, 7j and 7k. At that time, there are formed in the silicon substrate beneath the side spacers 6' the low concentrated n-type impurity regions 3t and 3w and the highly concentrated n-type impurity region 26 (FIG. 35B). The succeeding steps for manufacturing the $SiO_2$-film 17, highly resistive polysilicons 19g and 19h, the data lines 10c and 10d and the $SiO_2$-film 18 are carried out in the utterly same manner as in the case of the first embodiment.

According to the instant embodiment, tolerance in mask alignment for forming the photoresist mask on the gate can be increased, whereby the yield of manufacture can be enhanced.

Embodiment 21

Figure 36:
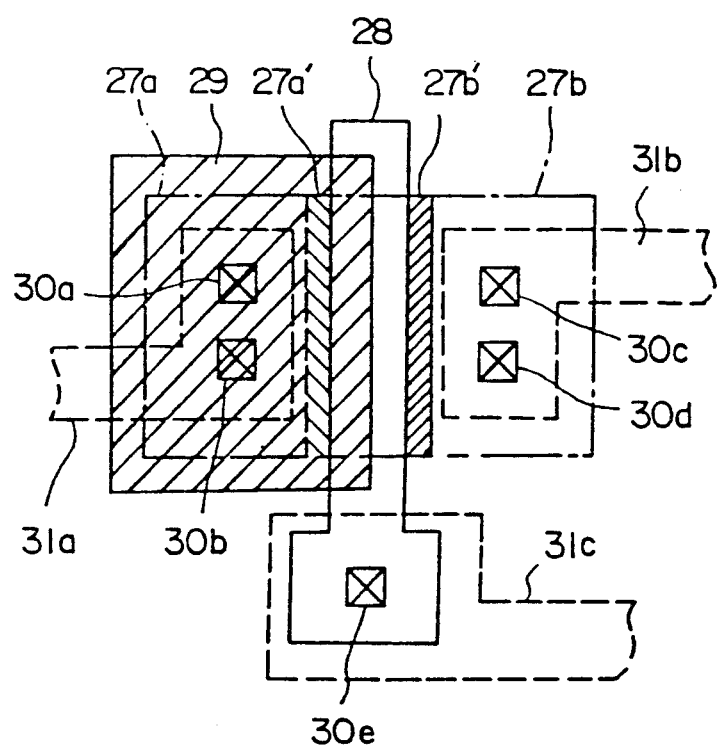

This embodiment is directed to a peripheral circuit of the static random access memory device to which the structure including a highly concentrated n-type impurity region formed in the low concentrated n-type impurity region on the side of the source of the driver LDD MOS FET and the manufacturing method therefor described hereinbefore in conjunction with the ninth or tenth embodiment are applied. FIG. 36 is a plan view showing a layout of an n-channel MOS FET constituting a part of the peripheral circuit of the static random access memory device according to the instant embodiment. By forming the photoresist 25 employed as the mask for ion implantation in the embodiments described hereinbefore by reference to FIGS. 34 and 35 in such a shape as that of the n-type impurity ion doped region 29 shown in FIG. 36, n-type impurity ions can be introduced by ion implantation in the portion constituting the source region of the n-channel MOS FET, whereby a highly concentrated impurity region 27a' having a desired concentration can be disposed between the highly concentrated impurity region 27a forming the source region and an end of the gate electrode 28.

According to the instant embodiment, a high-speed peripheral circuit can be implemented, because the drivability of the n-channel MOS FET used in the peripheral circuit of the static random access memory device can be increased. Although the instant embodiment is limited to the n-channel MOS FET, it should be mentioned that the operation speed of the peripheral circuit can further be increased by applying the method similar to the instant embodiment to the p-channel MOS FET as well.

Embodiment 22

This embodiment is directed to a structure of the static random access memory cell according to the nineteenth embodiment in which highly resistive polysilicons regions 19e, 19f, 19g and 19h shown in FIG. 32 for constituting the load elements of the cell are replaced by p-channel MOS FETs formed in polysilicon films. FIG. 37 is a plan view showing a one-bit corresponding portion of the load elements in the static random access memory cell according to the instant embodiment, which cell is realized in utterly the same structure as the first embodiment except for the load element. Referring to FIG. 37, the polysilicon films 33a and 33b of the second level formed in the insulation film on the n-channel MOS FET which is formed on the silicon substrate constitute the gate electrodes of p-channel MOS FETs formed in the polysilicon films and are connected through the holes 20i and 20j to the underlying storage nodes of the flip-flop circuit. Further, a thin insulation film of 30 nm in thickness is formed on the polysilicon films 33a and 33b of the second level and provided with holes 20k and 20l for interconnection.

Figure 38:
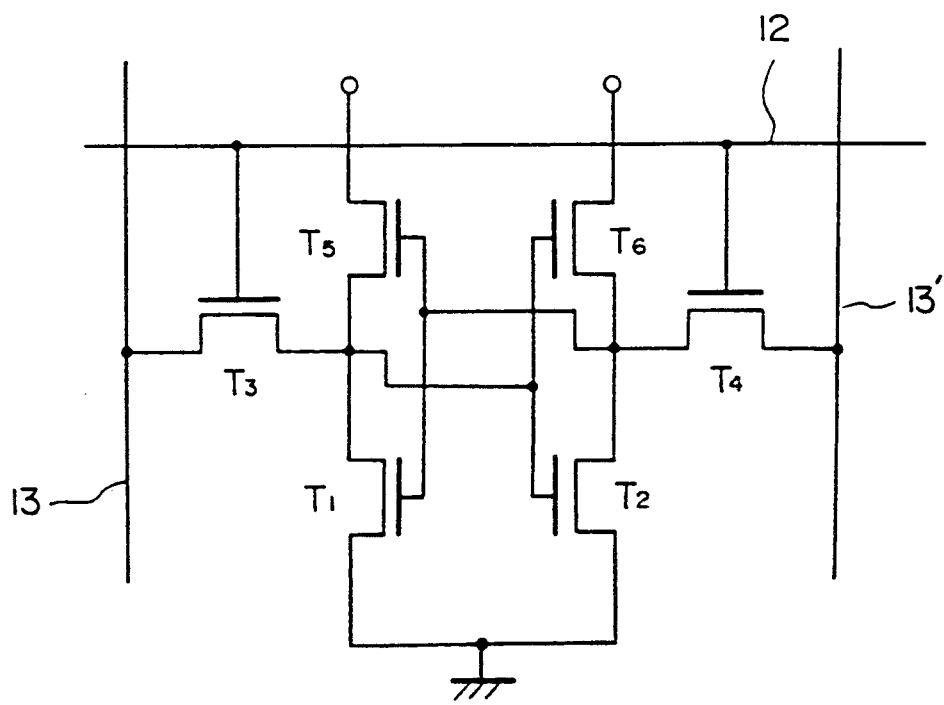
FIG. 38 is an equivalent circuit diagram of the semiconductor memory device shown in FIG. 37.

Formed on the insulation film are third level polysilicon films which constitute a source region 35a, a channel region 35b and a drain region 35c of a p-channel MOS FET, while constituting a source region 35f, a channel region 35e and a drain region 35d of another p-channel MOS FET. These two p-channel MOS FETs are connected together in the form of a flip-flop circuit to constitute a static random access memory cell whose equivalent circuit is shown in FIG. 38.

It is self-explanatory that the conductivity type may be reversed in the embodiments described above. According to the present invention, the transfer conduction of the driver MOS FET of the static random access memory cell can be made small, which means that the ratio in the transfer conductance between the transfer MOS FET and the driver MOS FET can be made constant even when the channel width of the driver MOS FET is diminished. Thus, there can be provided a semiconductor memory device including static random access memory cells and suited optimally for integration with a high packing density. Besides, since the parasitic resistance of the interconnecting portion where the driver MOS FET and the silicon substrate are directly connected to each other can be decreased with the parasitic resistance at the source of the driver MOS FET being reduced, the memory cell can be protected against unstable operation brought about by lowering of the potential at the storage node and rising of the ground potential.

It is further understood by those skilled in the art that the foregoing description is a preferred embodiment of the disclosed device and that various changes and modifications may be made in the invention without departing from the spirit and scope thereof.

What is claimed is:

1. A semiconductor static random access memory comprising:
 a substrate;
 a flip-flop circuit having a pair of driver insulated gate field effect transistors of a first conductivity type provided on the substrate;
 a pair of transfer insulated gate field effect transistors of the first conductivity type provided on the substrate; and
 storage nodes in said flip-flop circuit having pn-junctions formed in regions sandwiched between gate electrodes of said driver insulated gate field effect transistors and gate electrodes of said transfer insulated gate field effect transistor, wherein:
  the gate electrode of one of said driver insulated gate field effect transistors and a drain region of the other of said driver insulated gate field effect transistors are electrically coupled to each other through a first electrically conductive film,
  the drain region of said one driver insulated gate field effect transistor and a gate electrode of said other driver insulated gate field effect transistor are electrically coupled to each other through a second electrically conductive film,
  gate electrodes of the driver and transfer insulated gate field effect transistors extend substantially in parallel with each other, and
  channel regions of the driver and transfer insulated gate field effect transistors extend substantially in parallel with each other.

2. A semiconductor static random access memory according to claim 1, wherein said flip-flop circuit comprises two load insulated gate field effect transistors of a second conductivity type so as to provide a pair of complementary insulated gate field effect transistors wherein the load insulated gate field effect transistors are formed on at least one of said driver and transfer insulated gate field effect transistors with interposition of a first insulation film, said load insulated gate field effect transistors having gate electrodes formed of at least portions of said first and second electrically conductive films.

3. A semiconductor static random access memory according to claim 1, wherein said first and second electrically conductive films are automatically insulated from the gate electrodes of said driver and transfer insulated gate field effect transistors so that no short-circuit is formed even when mask misalignment for interconnecting holes takes place, and are electrically connected to the pn-junctions of the storage nodes, respectively, in said flip-flop circuit.

4. A semiconductor static random access memory according to claim 1, wherein a portion of an active region of said transfer insulated gate field effect transistor is connected to the storage node of said flip-flop circuit through said first or second electrically conductive film.

5. A semiconductor static random access memory according to claim 1, wherein said first and second electrically conductive films are polysilicon films doped with impurity of the first conductivity type.

6. A semiconductor static random access memory according to claim 1, wherein said first and second electrically conductive films are formed at a higher level than a third electrically conductive film with interposition of a second insulation film, wherein the third electrically conductive film comprises a plate electrode fixed to constant potential, wherein at least portions of the first electrically conductive film, the second insulation film and the third electrically conductive film form a first capacitor element, while at least portions of the second electrically conductive film, the second insulation film and the third electrically conductive film form a second capacitor element, said first and second capacitor elements being electrically connected to the storage nodes of the flip-flop circuit of the static random access memory.

7. A semiconductor static random access memory according to claim 1, wherein said first and second electrically conductive films are formed in a same polysilicon layer.

8. A semiconductor static random access memory according to claim 1, wherein channel regions of the load insulated gate field effect transistors are formed at least on portions of said first and second electrically conductive films, and wherein drain regions and gate electrodes of the load insulated gate field effect transistors are mutually cross-coupled, respectively.

9. A semiconductor static random access memory according to claim 1, wherein a first highly resistive element is electrically coupled between one of the two storage nodes and a fixed potential wiring and a second highly resistive element is electrically coupled between the other storage node and said fixed potential wiring.

10. A semiconductor static random access memory according to claim 1, wherein a predetermined high resistance is imparted to portions of said first and second electrically conductive films.

11. A semiconductor static random access memory according to claim 2, wherein a thickness of the channel portion of said load insulated gate field effect transistor is in a range of 1 to 320 nm.

12. A semiconductor static random access memory according to claim 2, wherein at least a portion of a gate insulating film of one of said load insulated gate field effect transistors is thinner than another portion thereof.

13. A semiconductor static random access memory according to claim 2, wherein the source region of said load insulated gate field effect transistor includes a silicide layer.

14. A semiconductor static random access memory according to claim 1, wherein the source region of said driver insulated gate field effect transistor is electrically coupled to a layer which is provided under a region in which the driver and transfer insulated gate field effect transistors are provided.

15. A semiconductor static random access memory according to claim 1, wherein impurity regions forming source and drain regions of said driver insulated gate field effect transistors are provided in an asymmetrical structure.

16. A semiconductor memory device having a static random access memory including flip-flop circuits each comprised of a pair of driver insulated gate field effect transistors having gate electrodes and drain regions mutually cross-coupled, respectively, and two transfer insulated gate field effect transistors connected to the cross-coupled portions of said flip-flop circuit, respectively, wherein in the driver insulated gate field effect transistor, highly concentrated impurity regions forming a drain region and a source region, respectively, are disposed with predetermined distances from first and second ends of the gate electrode, a low concentrated impurity region is disposed between the highly concentrated impurity region forming said drain region and the first end of said gate electrode, and wherein a highly concentrated impurity region having a desired concentration is disposed between a highly concentrated impurity region forming said source region and the second end of said gate electrode, and wherein an impurity concentration of said highly concentrated impurity region having said desired concentration is higher than the impurity concentration of said low concentrated impurity region and is equal to or lower than the impurity concentration of the highly concentrated region forming said source region.

17. A semiconductor memory device according to claim 16, wherein highly resistive elements are connected to the cross-coupling interconnections, respectively, in said flip-flop circuit.

18. A semiconductor memory device according to claim 16, wherein insulated gate field effect transistors of a conductivity type differing from a conductivity type of said driver insulated gate field effect transistors are connected to the cross-coupling portions, respectively, in said flip-flop circuit to thereby form a complementary inverter circuit.

19. A semiconductor memory device having a static random access memory comprising flip-flop circuits each including a pair of driver insulated gate field effect transistors having gate electrodes cross-coupled to counterpart drain regions, respectively, and two transfer insulated gate field effect transistors connected to the cross-coupling portions of said flip-flop circuit, respectively, wherein in said driver insulated gate field effect transistor, at least a highly concentrated impurity region forming the drain region is disposed with a predetermined distance from an end of the gate electrode, a low concentrated impurity region is disposed between said highly concentrated impurity region and said end of said gate electrode, and wherein said cross-coupling portion is connected to a highly concentrated impurity region forming the drain region of another insulated gate field effect transistor through a highly concentrated impurity region having a desired concentration at a desired portion of said gate electrode, and wherein the impurity concentration of said highly concentrated impurity region having said desired concentration is higher than the impurity concentration of said low concentrated impurity region and is equal to or lower than the impurity concentration of the highly concentrated impurity region forming said drain region.

20. A semiconductor memory device according to claim 19, wherein highly resistive elements are connected to the cross-coupled interconnection, respectively, in said flip-flop circuit.

21. A semiconductor memory device according to claim 19, wherein insulated gate field effect transistors of the conductivity type differing from that of said driver insulated gate field effect transistors are connected to the cross-coupling portions, respectively, in said flip-flop circuit to form a complementary inverter circuit.

22. A semiconductor memory device according to claim 16, wherein the storage node of said flip-flop circuit comprises a pn-junction formed in a region sandwiched between the gate electrode of the driver insulated gate field effect transistor and the gate electrode of the transfer insulated gate field effect transistor, said pn-junction being formed to occupy a surface area of a substrate in which said semiconductor memory device is formed which is smaller than a surface area of said substrate occupied by a channel portion of the driver or transfer insulated gate field effect transistor.

23. A semiconductor memory device according to claim 15, wherein a low concentrated impurity region is provided only on the side of the drain region of said driver insulated gate field effect transistor.

* * * * *